United States Patent
Rajendran et al.

(10) Patent No.: US 8,483,627 B2
(45) Date of Patent: Jul. 9, 2013

(54) CIRCUITS, PROCESSES, DEVICES AND SYSTEMS FOR FULL INTEGRATION OF RF FRONT END MODULE INCLUDING RF POWER AMPLIFIER

(75) Inventors: Gireesh Rajendran, Bangalore (IN); Apu Sivadas, Bangalore (IN); Subhashish Mukherjee, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 769 days.

(21) Appl. No.: 12/435,668

(22) Filed: May 5, 2009

(65) Prior Publication Data
US 2009/0289721 A1 Nov. 26, 2009

(30) Foreign Application Priority Data
May 9, 2008 (IN) ............................ 1144/CHE/2008

(51) Int. Cl.
*H04B 1/44* (2006.01)
(52) U.S. Cl.
USPC ............................................ 455/78; 327/530
(58) Field of Classification Search
USPC ................................ 455/78–83; 327/530–550
See application file for complete search history.

(56) References Cited

U.S. PATENT DOCUMENTS

| | | | |
|---|---|---|---|
| 5,554,865 | A | 9/1996 | Larson |
| 6,757,523 | B2 | 6/2004 | Fry |
| 6,779,261 | B2 | 8/2004 | Yue |
| 6,882,226 | B2 * | 4/2005 | Cho et al. ...................... 330/282 |
| 7,091,784 | B1 | 8/2006 | Terrovitis |
| 7,209,727 | B2 | 4/2007 | Casteneda et al. |
| 7,269,391 | B2 | 9/2007 | Chiu et al. |
| 7,369,096 | B2 | 5/2008 | Casteneda et al. |
| 2005/0208901 | A1 | 9/2005 | Chiu et al. |
| 2006/0135084 | A1 | 6/2006 | Lee |
| 2007/0069818 | A1 | 3/2007 | Bhatti et al. |
| 2007/0152904 | A1 | 7/2007 | Casteneda et al. |
| 2007/0225033 | A1 | 9/2007 | Yoon et al. |
| 2007/0280185 | A1 | 12/2007 | McFarland et al. |
| 2008/0182526 | A1 | 7/2008 | Moloudi et al. |
| 2010/0027568 | A1 | 2/2010 | Rajendran et al. |

OTHER PUBLICATIONS

Marholev, B. et al., "A Single-Chip Bluetooth EDR Device in 0.13um CMOS," Int'l Solid-State Circuits Conference (ISSCC) 2007. pp. 558-559, 621. Figs. 31.1.1-31.1.2.

(Continued)

*Primary Examiner* — Lincoln Donovan
*Assistant Examiner* — Diana J Cheng
(74) *Attorney, Agent, or Firm* — James F. Hollander; Wade J. Brady, III; Frederick J. Telecky, Jr.

(57) ABSTRACT

An electronic circuit comprising a transistor-based RF (radio frequency) power amplifier (112) having balanced outputs (172, 176), a transistor-based receiver RF amplifier (116) having balanced inputs (152, 156) ohmically connected to said balanced outputs (172, 176) respectively of said RF power amplifier (112), and a balun (114) having a primary (182, 186) and a secondary (188), said primary (182, 186) having primary connections and a supply connection (185) of said primary (182, 186) intermediate said primary connections and said primary connections ohmically connected both to said balanced outputs (172, 176) of said RF power amplifier (112) respectively and to said balanced inputs (152, 156) of said receiver RF amplifier, thereby to switchlessly couple RF between the balun (114) and the RF power amplifier (112) and switchlessly couple RF between the balun (114) and the receiver RF amplifier (116). Other electronic circuits, processes, devices and systems are disclosed.

34 Claims, 9 Drawing Sheets

OTHER PUBLICATIONS

Knopik, V. et al., "0.18 um thin oxide CMOS transceiver front-end with integrated Tx/Rx/ commutator for low cost Bluetooth solutions," Proc. 29th European Solid-State Circuits Conference (ESSCIRC), 2003. pp. 675-678, Figs. 1-5.

Yamamoto, K., et al., "A 2.4-GHz-band 1.8-V operation single-chip Si-CMOS T/R-MMIC front-end with a low insertion loss switch," IEEE J. Solid-State Circuits 36(8). Aug. 2001. pp. 1186-1197. Figs. 1, 10, 13.

Bhatti, I., et al., A fully integrated transformer-based front-end architecture for wireless transceivers, Int'l Solid-State Circuits Conference (ISSCC) 2005. vol. 1, pp. 106-107, 587. Figs. 5.8.2-5.8.4.

* cited by examiner

CIRCUITS, PROCESSES, DEVICES AND SYSTEMS FOR FULL INTEGRATION OF RF FRONT END MODULE INCLUDING RF POWER AMPLIFIER

CROSS-REFERENCE TO RELATED APPLICATIONS

This application is related to India Patent Application Number 1144/CHE/2008 filed May 9, 2008, titled "WLAN T/R Switch Elimination and Front End Integration" and priority is claimed under the Paris Convention and 35 U.S.C. 119 and all other applicable law.

This application is related to U.S. patent application Ser. No. 12/181,327 filed Jul. 29, 2008, titled "Technique for Sharing Transmit and Receive Ports of a CMOS Based Transceiver" which is hereby incorporated herein by reference in its entirety.

STATEMENT REGARDING FEDERALLY SPONSORED RESEARCH OR DEVELOPMENT

Not applicable.

COPYRIGHT NOTIFICATION

Portions of this patent application contain materials that are subject to copyright protection. The copyright owner has no objection to the facsimile reproduction by anyone of the patent document, or the patent disclosure, as it appears in the United States Patent and Trademark Office, but otherwise reserves all copyright rights whatsoever.

BACKGROUND OF THE INVENTION

This invention is in the fields of wireless communications and electronics and is more specifically directed to improved circuits, devices, and systems for wireless communication, and processes of operating and making them.

Mobile telephony can communicate video and digital data, and voice over packet (VoP or VoIP), in addition to cellular voice. Streams of information such as video, voice, audio content, images of all kinds, and data should be flexibly handled by such mobile devices and platforms.

WLAN systems use time division multiplexing for Transmitting and Receiving signals. The signals use the same frequency band. The system uses a single antenna for both transmission (TX) and reception (RX). This is possible by using a T/R switch, which is a switch that toggles the antenna between TX and RX. The T/R switch needs high linearity at high signal swing and is usually manufactured separately and used as a printed circuit board component. A block diagram of a conventional WLAN front end with T/R switches is shown in FIG. 1. For each communications band, a T/R switch couples an antenna either to a power amplifier PA or to a first balun to a low noise amplifier LNA of a receiver. A pre-power amplifier PPA supplies power through a second balun and a matching network to the PA.

It would be desirable if the entire RF front end (multiple Power Amplifiers (PA), receiver front end, T/R switches, passives) could be integrated with the baseband and radio or portions eliminated somehow and the remainder be fully integrated for WLAN, cellular and other communications. The WLAN PA has been integrated into standard CMOS die in DRP™ integrated circuits from Texas Instruments Incorporated but it is believed that no T/R switch integration or T/R switch elimination has been achieved so far. Such a partial integration is not very attractive since T/R switching remains separate from, and not integrated with, an RF front end module.

Containing or reducing chip area (real estate), energy dissipation, signal loss, and the cost of manufacture while providing a variety of circuit and system products with performance features for different market segments are important goals in integrated circuits generally and system-on-a-chip (SOC) design.

Further advantageous solutions and alternative solutions would, accordingly, be desirable in the art.

SUMMARY OF THE INVENTION

Generally and in one form of the invention, an electronic circuit includes a transistor-based RF (radio frequency) power amplifier having balanced outputs, a transistor-based receiver RF amplifier having balanced inputs ohmically connected to the balanced outputs respectively of the RF power amplifier, and a balun having a primary and a secondary, the primary having primary connections and a supply connection of the primary intermediate the primary connections and the primary connections ohmically connected both to the balanced outputs of the RF power amplifier respectively and to the balanced inputs of the receiver RF amplifier, thereby to switchlessly couple RF between the balun and the RF power amplifier and switchlessly couple RF between the balun and the receiver RF amplifier.

Generally and in another form of the invention, a wireless communication circuit includes a plurality of electronic circuits, each including a transistor-based RF (radio frequency) power amplifier having balanced outputs, a transistor-based receiver RF amplifier having balanced inputs ohmically connected to the balanced outputs respectively of the RF power amplifier, and a balun having a primary and a secondary, the primary having primary connections and a supply connection of the primary intermediate the primary connections and the primary connections ohmically connected both to the balanced outputs of the RF power amplifier respectively and to the balanced inputs of the receiver RF amplifier, thereby to switchlessly couple RF between the balun and the RF power amplifier and switchlessly between the balun and the receiver RF amplifier; and the balun secondaries of the electronic circuits connected in series, whereby to establish a power combiner, and each receiver RF amplifier having balanced outputs coupled in parallel with the balanced outputs of each other receiver RF amplifier of the electronic circuits, whereby to increase signal-to-noise ratio.

Generally and in a further form of the invention, an electronic circuit includes a transistor-based RF (radio frequency) power amplifier having balanced outputs and sharing transistors with a transistor-based receiver RF amplifier having balanced inputs identical with the balanced outputs of the RF power amplifier respectively, and a balun having a primary and a secondary, the primary having primary connections and a supply connection of the primary intermediate the primary connections and the primary connections ohmically connected to the balanced outputs of the RF power amplifier respectively thereby to couple RF between the balun and the shared transistors of the RF power amplifier and the receiver RF amplifier.

Generally, a process of operation form of the invention includes splitting and coupling supply current along balanced lines to balanced outputs of an RF power amplifier and balanced inputs of a receiver RF amplifier, and alternately either transmittingly RF power amplifying or receivingly RF transconducting switchlessly on the balanced lines.

Generally, a process of manufacture form of the invention includes integrating on a single semiconductor integrated circuit chip a transistor-based RF (radio frequency) power amplifier having balanced outputs, a transistor-based receiver RF amplifier having balanced inputs ohmically connected to the balanced outputs respectively of the RF power amplifier, and a balun having a primary and a secondary, the primary having primary connections and a supply connection of the primary intermediate the primary connections and the primary connections ohmically connected switchlessly both to the balanced outputs of the RF power amplifier respectively and to the balanced inputs of the receiver RF amplifier.

These and other circuit, device, system, apparatus, process, and other forms of the invention are disclosed and claimed.

BRIEF DESCRIPTION OF THE DRAWINGS

Corresponding numerals in different figures indicate corresponding parts except where the context indicates otherwise. The letters x and i are used to refer to certain numerals in general and for indexing.

DETAILED DESCRIPTION OF EMBODIMENTS

Figure 2:
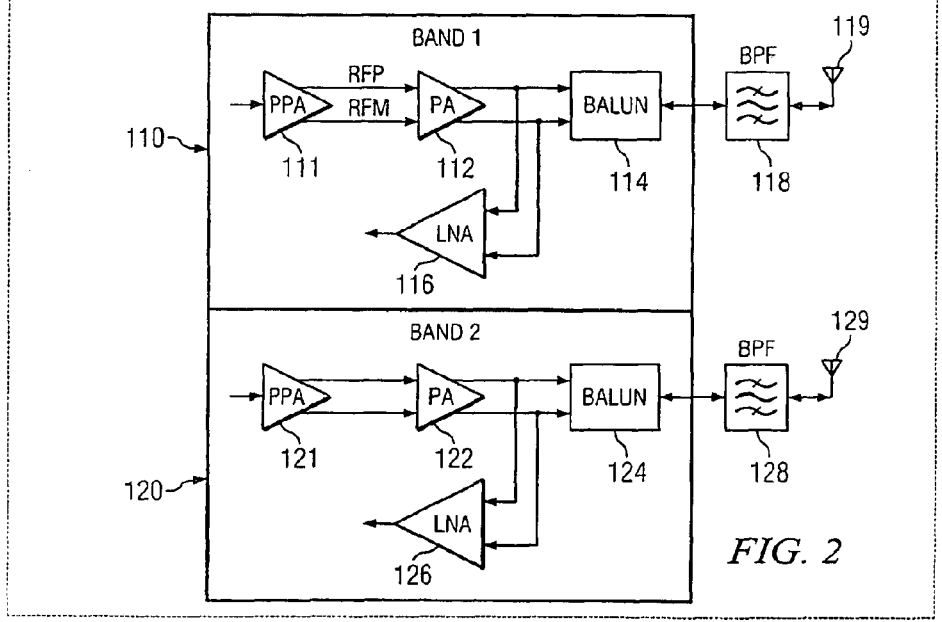
FIG. 2 is a block diagram of an inventive integrated RF front end with T/R switch elimination and other inventive features.

FIG. 2 shows a block diagram of integrated RF front end with T/R switch elimination and for WLAN, cellular and other communications. A solution to the problem provides embodiments wherein the T/R switch is completely eliminated by shorting, i.e. ohmically connecting, the LNA input with the PA output. This circuit embodiment completely integrates the RF Front End (FE).

In FIG. 2, greatly simplified and completely integrated RF front ends 110 and 120 are provided for respective communications band 1 and band 2. RF front end 110 is coupled by a band pass filter BPF 118 bidirectionally to a communications antenna 119. Similarly, RF front end 120 is coupled by a band pass filter BPF 128 bidirectionally to a communications antenna 129.

Further in FIG. 2, integrated RF front end 110 has a pre-power amplifier PPA 111 driving balanced outputs RFP and RFM directly to corresponding balanced inputs of a power amplifier PA 112. PA 112 has balanced outputs ohmically coupled to a balun 114 which transmits through band pass filter BPF 118 and antenna 119. Conversely, antenna 119 is coupled through band pass filter 118 and balun 114 directly and ohmically to balanced inputs of low noise amplifier LNA 116. Here, the balanced outputs of PA 112 are ohmically connected to the balanced inputs of low noise amplifier LNA 116. Further, for band 2, integrated front end 120 is constructed in a manner analogous to that of integrated front end 110 wherein blocks 12x correspond respectively to blocks 11x.

Figure 1:
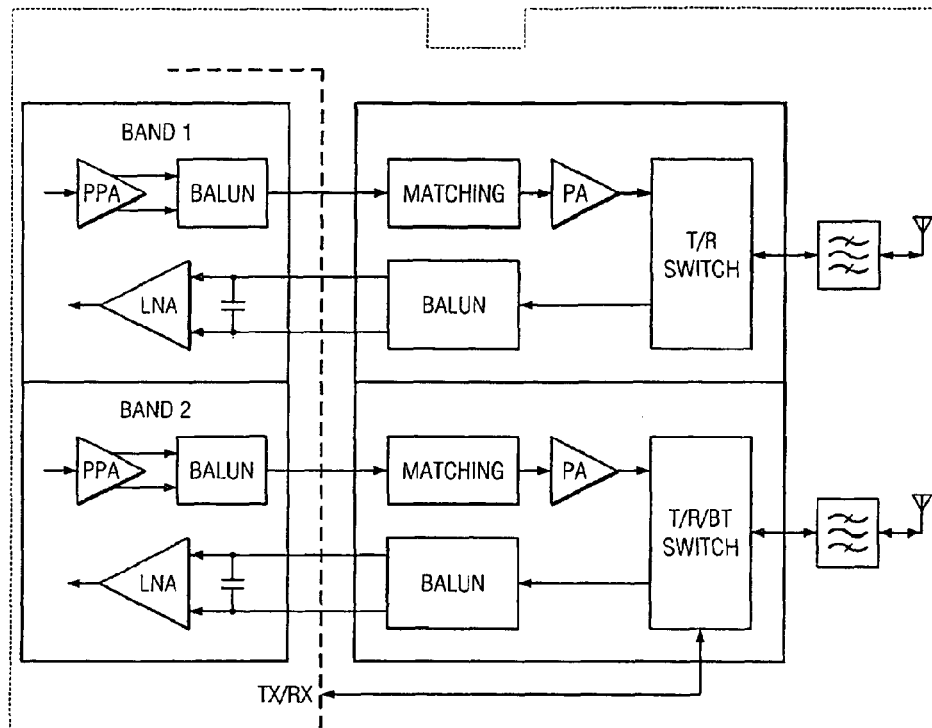
FIG. 1 is a block diagram of a conventional RF front end with T/R switches.

In this way, in FIG. 2, each RF front end 110 and 120 is fully integrated as respective embodiments. Both T/R switches of FIG. 1 are eliminated, and two of the baluns in FIG. 1 and their associated matching networks are eliminated as well. Ohmic direct coupling of PA 112, LNA 116 and balun 114, i.e. shorting them to each other, economically conserves chip real estate, reduces costs and reduces power dissipation. This is called an "input output short" herein. Power switching circuitry for PA and LNA as described elsewhere herein (see FIGS. 4A and 4B) is outside of the signal paths and economically and effectively obviates T/R switches.

Figure 3:
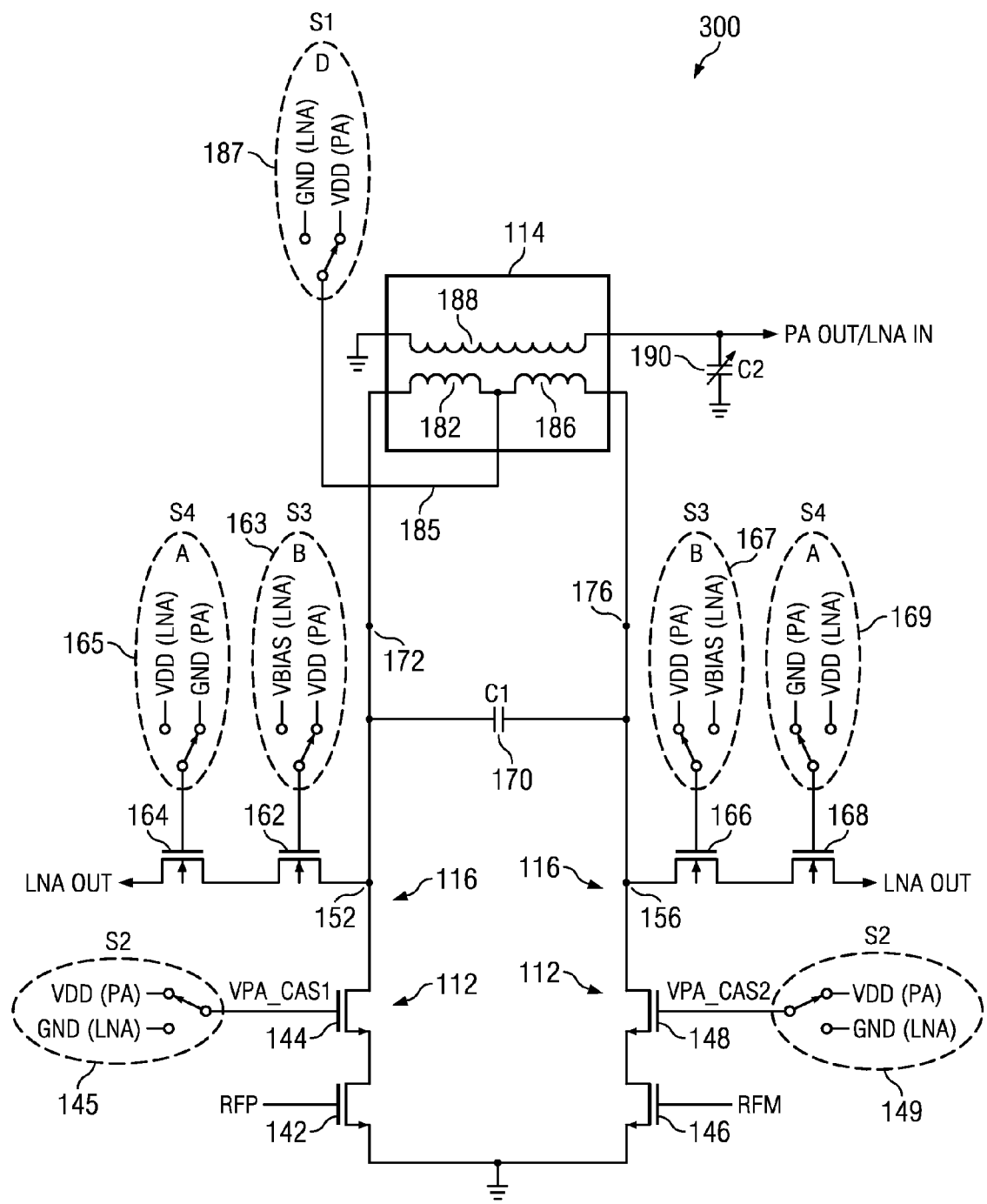
FIG. 3 is a schematic diagram of an inventive integrated RF front end with T/R switch elimination and other inventive features.
Figure 4A:
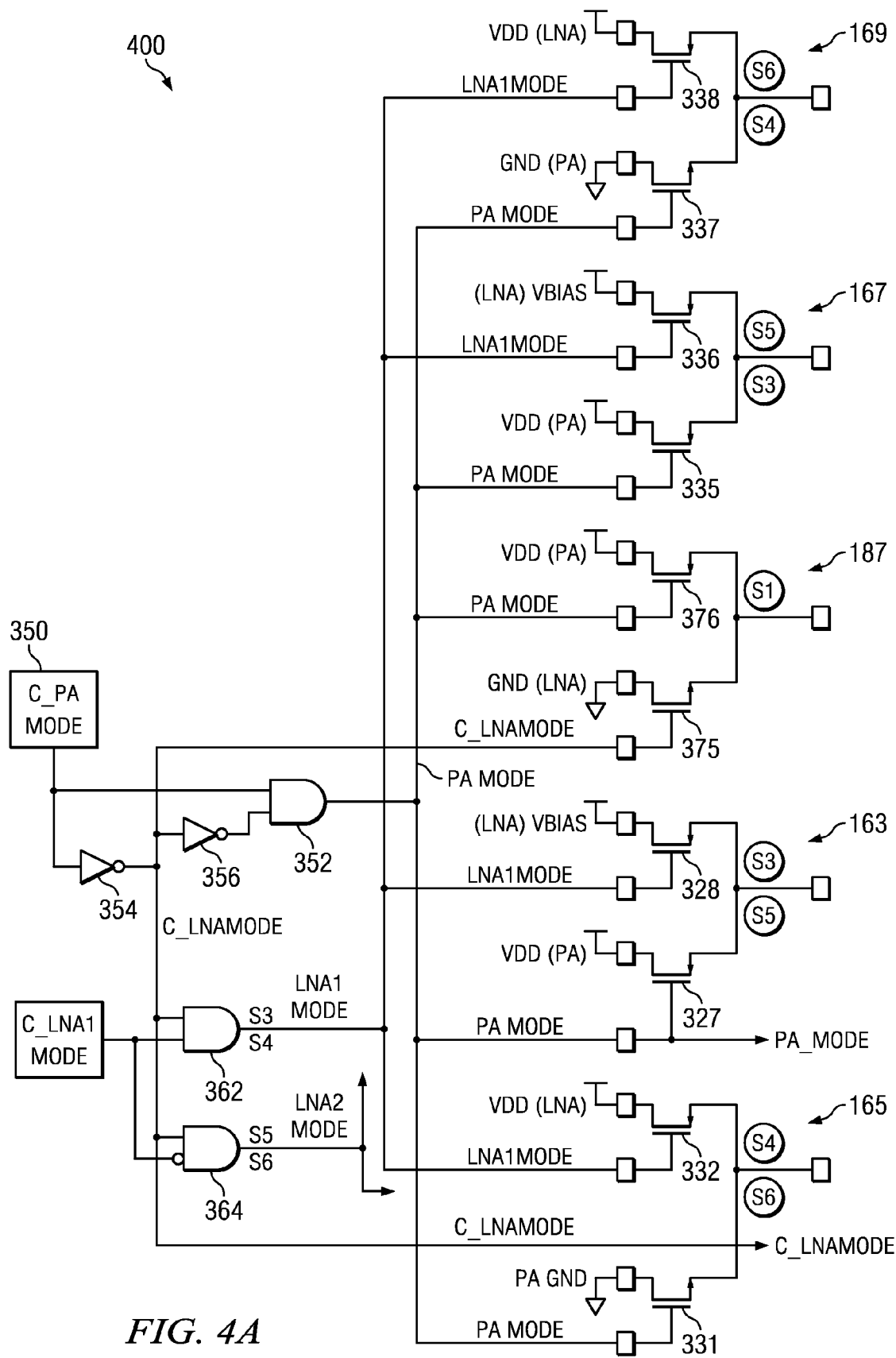
FIGS. 4A and 4B are two parts of a composite schematic diagram of inventive control circuitry for use in the integrated RF front ends of FIGS. 3, 5, 6, 7, and 8.
Figure 4B:
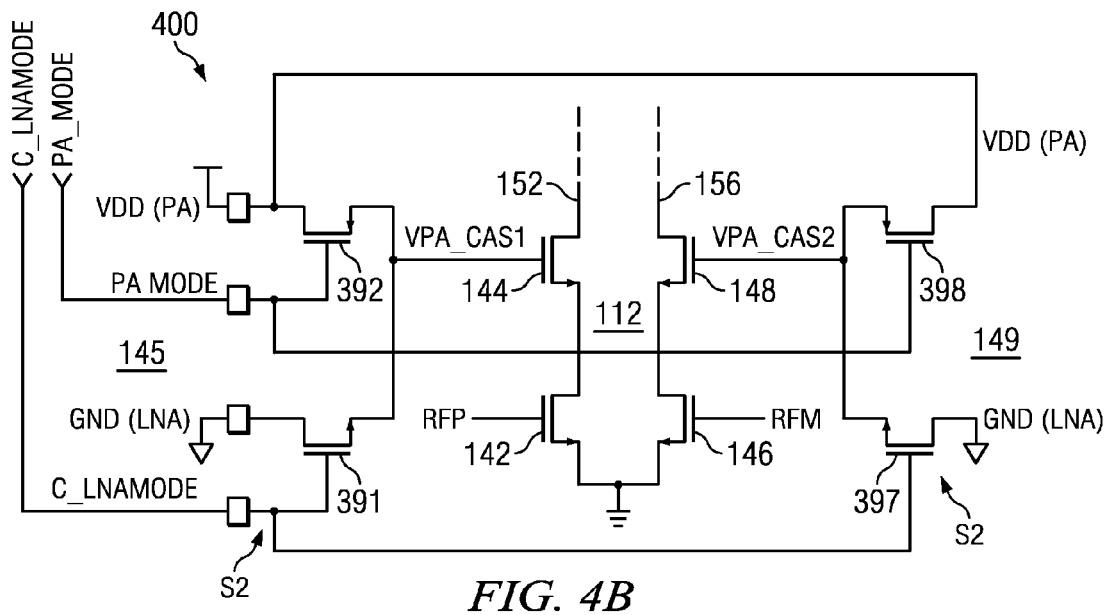

In FIGS. 2 and 3, a circuit embodiment eliminates the T/R Switch and provides full RF front end integration on a single semiconductor chip integrating together balun 114, RF power amplifier 112, and receiver RF amplifier 116, and can integrate PPA 111 therewith as well. A switching circuit embodiment such as switching circuit 400 of FIGS. 4A and 4B is operable to alternately enable RF power amplifier 112 or receiver RF amplifier 116 in response to a transmit/receive control input, and the switching circuit 400 is suitably integrated into the single semiconductor chip also. The switching circuit 400 beneficially switches voltages isolated from RF for control of and low loss in RF power amplifier 112 and receiver RF amplifier 116.

Integrating a T/R switch in the RF power output path in a deep-submicron CMOS process presents linearity and reliability challenges at high voltage swing, and these challenges do not need to be addressed here because the T/R switching itself is eliminated. The circuitry of FIG. 2 shorts (connects) the LNA and PA and eliminates the T/R switching in FIG. 1.

In FIGS. 3 and 5-8, circuit embodiments for achieving such an input output short (a) preserve the input/output performance of the system such as WLAN, cellular, TDMA (time division multiple access) and/or Bluetooth and also (b) promote linearity and reliability. DC (direct current) power switches of FIGS. 4A and 4B isolate the LNA function from PA function. These switches can connect to Supply, Bias, and or Ground and hence can be easily integrated. ("Ground" refers to an electrical circuit common power rail, e.g. metallization, herein and does not require any earth ground. Supply and bias can be supplied on additional power rails.) A Common Gate LNA is provided and achieves wide band match. This helps in shorting PA and LNA while maintaining desirable performance. TABLE 1 provides a glossary useful in interpreting FIGS. 2-8.

TABLE 1

GLOSSARY

| Abbreviation | Meaning |
| --- | --- |
| BPF | Band Pass Filter |
| DC | Direct Current |
| FE, FEM | Front End, Front End Module |
| FET | Field Effect Transistor |
| LNA | Low Noise Amplifier |
| PA | Power Amplifier |
| PPA | Pre-Power amplifier |
| RFP | Radio Frequency in-phase signal (Plus) |
| RFM | Radio Frequency out-of-phase signal (Minus) |
| SoC | System on a Chip |
| SNR | Signal-to-Noise Ratio |
| VPA_CAS | Voltage bias of Power Amplifier - Cascode |
| VBIAS | Voltage Bias for common gate amplifier gate |
| WLAN | Wireless Local Area Network |

In FIG. 3, a PA-plus-LNA circuit embodiment 300 has T/R Switch Elimination Power switches in non-signal path are used instead of transmit/receive (T/R) switching. Insertion loss of signal due to T/R switch is eliminated by direct ohmic connection along with N:1 balun transformer for better LNA noise match and PA power optimization. As an extension, the balun transformer can be replaced with a matching network or additional matching network can be used at the primary or secondary side.

In FIG. 3, DC power current runs via the center tap 185 through the balun itself to the PA 112, and PA 112 conversely delivers amplified RF to balun 114, instead of embodiment 300 capacitively coupling only RF between PA 112 and balun 114. An integrated balun (on-chip) 114 integrated in a CMOS process has acceptable insertion loss comparable to the insertion loss of external (off-chip) low-cost baluns and handles the DC and RF currents involved in power amplifier PA 112 operation. Thus an external (off-chip) balun is not necessary and is eliminated.

Two transistors 142 and 144 (and 146 and 148) in each side of the PA 112 perform PA functions in an electrically balanced manner. Transistors 142 and 146 have their FET gates coupled to respond to respective PPA 111 signal voltage outputs RFP and RFM and converts this PPA signal voltage to PA-amplified signal current. Here, the signal current=signal voltage times the transconductance of PA transistor 142 (146). Transistors 142 and 146 have their sources connected together to PA ground and their drains are connected to the sources respectively of transistors 144 and 148. Each second transistor 144 (148) has its drain ohmically connected to point 152 (156) to a respective input transistor 162 (166) of LNA 116 and also ohmically connected via line 172 (176) to balun 114 primary sections 182 (186).

A transmit mode is established by power switches 145 and 149 so that second transistors 144 and 148 each have their gate fed via respective switch line VPA CAS1 and VPA CAS2 with power supply voltage VDD(PA). The transistors 144 and 148 act as a RF buffer amplifier for delivering balanced PA signal current via lines 172 (176) to opposite sections 182 and 186 of the balun 114 that presents the PA load impedance. This buffer 144 (148) in receive mode responds to power switch 145 (149), each switch being of a circuit type designated S2, and each such buffer 144 (148) with its gate grounded to GND(LNA) instead functions as an isolation device from PA output to LNA input.

Balun sections 182 and 186 of the balun primary are intermediately and substantially centrally connected by center tap 185. A power switch 187 connects center tap 185 to PA power supply voltage VDD(PA) or to LNA ground GND(LNA) depending on transmit or receive mode. In other words, switch 187 at the intermediate node of balun primary is used to couple power supply in transmit TX mode to the RF power amplifier PA 112 and alternatively switchably couple ground (or common node) in receive RX mode to LNA 116. Power switches in FIG. 3 are placed at points with negligible signal content to minimize signal loss. Power switches are placed at transistor gates and the balun center tap, neither of which sees signal, so that all the power switches in FIG. 3 are isolated from RF signal paths of both PA 112 and LNA 116.

In FIG. 3, a capacitor 170 is connected across balanced lines 172 and 176. Parameters like balun 114 insertion loss and the impedance offered by balun 114 to PA 112 and LNA 116 can be set to the desired value at the given operating frequency by establishing, setting or tuning the capacitance value C1 of capacitor 170 across balun sections 182 and 186 along with establishing, setting or tuning a capacitance value C2 of a variable capacitor 190 connected to the single-ended secondary section 188 at antenna side of balun 114. An antenna 119 (129, 1015, 1545 or otherwise herein) is switchlessly coupled across said balun secondary 188. Various alternative matching network configurations, such as "T" or "Pi" or other type matching circuits may be suitably provided. A circulator (not shown) may also be provided to compensate for variations in SWR (standing wave ratio) in the antenna circuit.

LNA 116 has a balanced front end ohmically connected at points 152 and 156 to lines 172 and 176. This balanced front end has two pairs of LNA transistors 162, 164 and 166, 168. LNA transistors 162 and 166 have their sources connected to balun sections 182 and 186 respectively and act as a balanced transconductor to convert the voltage across the balun sections to a signal current. This signal current equals the multiplicative product of received signal voltage times transconductance of this LNA transistor 162 (166), which sends it to the succeeding transistor device 164 (168). Transistor 164 (168) is connected cascode (common gate for RF). This cascode transistor 164 (168) acts as a buffer amplifier to generate and deliver the output signal current to LNA load (presented by succeeding receiver circuitry that is unnecessary to show in this drawing) across the balanced outputs LNA OUT. The circuitry 300 with balun and lines 172 and 176 switchlessly couples both supply current and RF between the balun 114 and the RF power amplifier 112 and switchlessly couples both supply current (in the opposite direction) and RF between the balun 114 and the receiver RF amplifier 116.

In FIG. 3, LNA 116 balanced inputs are ohmically connected at points 152, 156 to the PA 112 balanced outputs. The LNA 116 input impedance is suitably designed to be similar to or substantially the same as the PA 112 output impedance. The antenna is nominally 50 ohms on the other side of a matching network that is in effect constituted by capacitances C1 and C2 and balun 114. At the PA/LNA side of balun 114 across lines 172 and 176, the impedance seen is or can be different from 50 ohms based on the balun 114 construction and capacitances C1 and C2. For higher power PA 112, the balun 114 is suitably designed by the skilled worker to offer impedance less than 50 ohms to PA/LNA (approximately in a range 10 to 20 ohms, for instance).

To make LNA 116 input impedance be similar to the PA 112 output impedance, a suitable design process is as follows. PA 112 is designed, such as by appropriate selection and sizing of the integrated circuit transistors 142, 144, 146, 148 to deliver desired specified RF power. PA 112 has a resulting output impedance $Z_{out}$. Balun 114 together with capacitances C1 and C2 are designed to offer PA 112 an impedance Z approximating that output impedance $Z_{out}$ that will permit PA 112 to deliver desired specified RF power. Put another way, balun 114 together with capacitances C1 and C2 is designed to transform PA 112 output impedance $Z_{out}$ and offer antenna 119 an acceptable impedance match to the antenna impedance thereby to permit PA 112 to deliver desired specified RF power. LNA 116 is then designed to have an input impedance $Z_{in}$ approximating impedance Z presented across points 152 and 156.

In FIG. 3, the embodiment 300 has a common-gate LNA 116, and the input impedance $Z_{in}$ offered by LNA 116 is equal to the reciprocal of the transconductance (i.e., 1/transconductance) of LNA transistor 162 (166). Thus, the LNA 116 input impedance $Z_{in}$ can be conveniently varied by changing the LNA transistor 162 (166) device size and/or current. Higher transconductance means lower inherent noise for LNA 116, and higher power PA 112 design desirably leads to a lower noise figure for LNA 116 in embodiment 300.

DC power switching for each FET gate of LNA signal path transistors 162, 164, 166, 168 is provided by respective power switches 163, 165, 167, 169. The circuitry for each of power switches 163 and 167 is a switch type designated S3, and the circuitry for each of power switches 165 and 169 is a switch type designated S4. Power switches 163 and 167 in transmit mode (PA mode) couple PA power supply voltage VDD(PA) to the gate of LNA transistors 162 and 166 which shuts off the transistors 162 and 166. Power switches 165 and 169 in transmit mode concurrently ground the gate of transistors 164 and 168 which shuts the transistors 164 and 168 off as well. In receive mode (LNA mode), power switches 163 and 167 couple LNA bias voltage VBIAS(LNA) to the gate of transistors 162 and 166 so that they operate effectively as low noise receiver RF amplifier transistors sized and biased to present the appropriate input impedance $Z_{in}$ to at least approximately match impedance Z resulting from transformed antenna impedance presented across points 152 and 156. Further in receive mode, power switches 165 and 169 concurrently provide LNA power supply voltage VDD(LNA) to LNA transistors 164 and 168 so that LNA transistors 164 and 168 operate effectively as an LNA output buffer to downstream receiver circuitry connected across outputs LNA OUT. The operating process for transmit/receive in FIG. 3 thus variously and symmetrically switches voltages isolated from RF to control the RF power amplifier 112 and receiver RF amplifier 116.

Advantageously, various embodiments completely and synergistically integrate and operate the Front End module of a WLAN or other telecom system in a standard CMOS or other materials fabrication process. This integration results in BOM (Bill of materials) expense reduction and chip real estate space reduction. The integrated RF front end also supports advanced WLAN and other telecom generations with MIMO (multiple input multiple output) and multiple antennas for spatially diverse transmission/reception paths for ISM band and other telecom high performance transceiver SoC. In one example, the PC board real estate for a PA plus T/R switch plus three passive devices might represent about almost 20% of the area used for 802.11bgn/BT/FM functionality (WLAN, Bluetooth, and FM receiver). Significant real estate reduction and cost expense reduction can result from RF front end integration as taught herein.

FIGS. 4A and 4B together depict control circuitry 400 that includes the above-mentioned power switches 145, 149, 163, 165, 167, 169, and 187 of FIG. 3. Notice that each of these power switches has two transistors. A first one of the two switch transistors has a FET gate. Collectively, such respective FET gates for first transistors 327, 331, 335, 337, 376, 392, 398 are coupled via respective control lines responsive to control line PA MODE and ultimately responsive to a single transmit/receive control line designated C_PA MODE to activate transmission by PA 112. Each such first transistor has a controlled source or drain connected to a power switched FET gate or line in FIG. 3, and further has a controlled drain or source connected to PA-related power rail VDD(PA) or GND (PA) as appropriate to effectuate the power switching depicted in FIG. 3.

The second transistor in each of these power switches has a FET gate coupled to a control line, e.g., designated C_LNA-MODE or LNA1MODE to activate the LNA operation. This second transistor has a controlled source or drain connected to an above-mentioned power switched FET gate or line in FIG. 3, and further has a controlled drain or source connected to LNA-related voltage rail VDD(LNA), VBIAS(LNA) or GND(LNA) as appropriate to effectuate the LNA voltage switching depicted in FIG. 3. In FIG. 4A and FIG. 4B, the PA-related first transistors are numbered 327, 331, 335, 337, 376, 392, 398 in the power switches. The LNA-related second transistors are numbered 328, 332, 336, 338, 375, 391, 397 in the power switches.

Both grounds GND(PA) and GND(LNA) are suitably connected together and to the ground or common where PA transistors 142 and 146 are grounded. Different PA GND and LNA GND means that in some embodiments there can be a potential difference between them with a polarity or magnitude of that potential difference. They are treated as ground signal, i.e. 0 V as indicated by "GND". They can be tied together at the IC level or at the board (PCB) level. When connected together at the board level, a few tens of millivolts of potential difference at IC level can be tolerated by the circuit without losing the functionality or performance. As for gate switching on the FIG. 3 transistors 142, 146 for RFP/RFM when LNA is active, if RFP/RFM are still active when LNA is active, gate switching happens when the mode is changed from LNA to PA or PA to LNA (or different LNA taps) and feed-through during such instance is not an issue. Some embodiments force RFP/RFM inactive at this time as well.

FIGS. 4A and 4B have further interlock and control circuitry 352, 354, 356, 362, 364 to appropriately activate and deactivate the control lines such as PA MODE, C_LNA-MODE, LNA1MODE, etc. A first master input control line C_PA MODE is connected to a first input of AND-gate 352 and to the input of an inverter 354. The output of inverter 354 drives control line C_LNAMODE and is also coupled to the input of an inverter 356 and to a first input of each of AND-gates 362 and 364. The output of inverter 356 is connected to a second input of AND-gate 352. AND-gate 352 drives the control line PA MODE connected to the gates of the first transistors of the all the power switches in this example circuitry. Control line C_LNAMODE is coupled to the gates of transistor 375, 391 and 397 in FIGS. 4A and 4B. Switching circuit 400 is thus operable to alternately enable said RF power amplifier or said receiver RF amplifier A second master input control line C_LNA1MODE is connected to a second input of AND-gate 362 and to an inverting input that is second input of AND-gate 364. C_LNA1MODE is maintained high for the RF front end of FIG. 3, so that AND-gate 362 is qualified and AND-gate 364 has its output held disqualified low at all times for operation of the circuit of FIG. 3. (See description of FIGS. 4A, 5, 7 and 8 for balun tap selection when C_LNA1MODE is permitted to go low.) The output of AND-gate 362 drives the control line LNA1MODE connected to the gates of second transistors 328, 332, 336, and 338 of the LNA power switches 163, 165, 167 and 169 in this example circuitry.

Operation of the interlock and control circuitry in FIGS. 4A and 4B protects the LNA 116 in the transmit mode when PA 112 is active. When master input control line C_PA MODE transitions from low to high, AND-gate 352 activates control line PA MODE for transmission after two inverter delays defined by inverters 354 and 356 plus gate delay of AND-gate 352. In the meantime, however, the receiver LNA 116 is turned off and protected because inverter 354 makes the control line C_LNAMODE go inactive low and disqualify inverters 362 and 364 so that both control lines LNA1MODE and LNA2MODE go inactive. Subsequently, when a transmission is completed, master input control line C_PA MODE transitions from high to low and immediately disqualifies AND-gate 352 so control line PA MODE goes low before either of control lines LNA1MODE or LNA2MODE can be activated.

In FIGS. 4A and 4B integrated supply voltage switches of herein-designated types S1, S2, S3, S4 are provided and controlled according to various control modes. Switches S3 and S4 are replicated as switches S5 and S6 to control additional LNA circuitry in FIG. 5 multi-tap embodiment.

In FIGS. 4A/4B, one LNA tap section is on at a time with AND gate 362 and 364 outputs separated (for different LNA modes LNA1MODE and LNA2MODE). FIG. 4A shows an interlocked tap1-tap2-responsive control circuitry to operate tap LNA gates of FIG. 5. The LNA taps (in multitap or multigain cases) each have two states: 1) OFF—in PA mode or when the particular LNA tap/gain setting is not desired and 2) ON—in LNA mode when the particular LNA tap/gain section is desired. Gate switching happens when the mode is changed from LNA to PA or PA to LNA (or between different LNA taps).

The following switch voltages are used in FIGS. 3-8. In the following list, "Bias 1" signifies voltage for receive (LNA) mode, and "Bias 2" signifies voltage for transmit (PA) mode.

A—Switch 'S4' is used→Bias 1—VDD and Bias 2—GND
B—Switch 'S3' is used→Bias 1—VBIAS and Bias 2—VDD
C—Switch 'S2' is used→Bias 1—GND and Bias 2—VDD
D—Switch 'S1' is used→Bias 1—GND and Bias 2—VDD A power and bias switching arrangement is used in FIGS. 3, 5, 6 and 7 and 8. One control approach is shown in TABLE 2 and FIGS. 4A/4B. There, different power voltages for PA and LNA are accommodated. In receive mode LNA buffer transistors 162, 164, 166, 168 164 and 168 have their gates energized a when LNA1MODE is active, and their gates disconnected when LNA1MODE is inactive low. The interior tap LNA buffer transistors 462, 464, 466, 468 in FIG. 5 have their gates energized a when LNA2MODE is active, and their gates are disconnected when LNA2MODE is inactive low.

TABLE 2

MODES OF OPERATION AND OF CONTROL CIRCUITRY

| Mode | S1 | S2 | S3 | S4 | S5 | S6 |
|---|---|---|---|---|---|---|
| PA | VDD(PA) | VDD(PA) | VDD(PA) | GND(PA) | VDD(PA) | GND(PA) |
| LNA1 | GND(LNA) | GND(LNA) | VBIAS(LNA) | VDD(LNA) | — | — |
| LNA2 | GND(LNA) | GND(LNA) | — | — | VBIAS(LNA) | VDD(LNA) |

Figure 5:
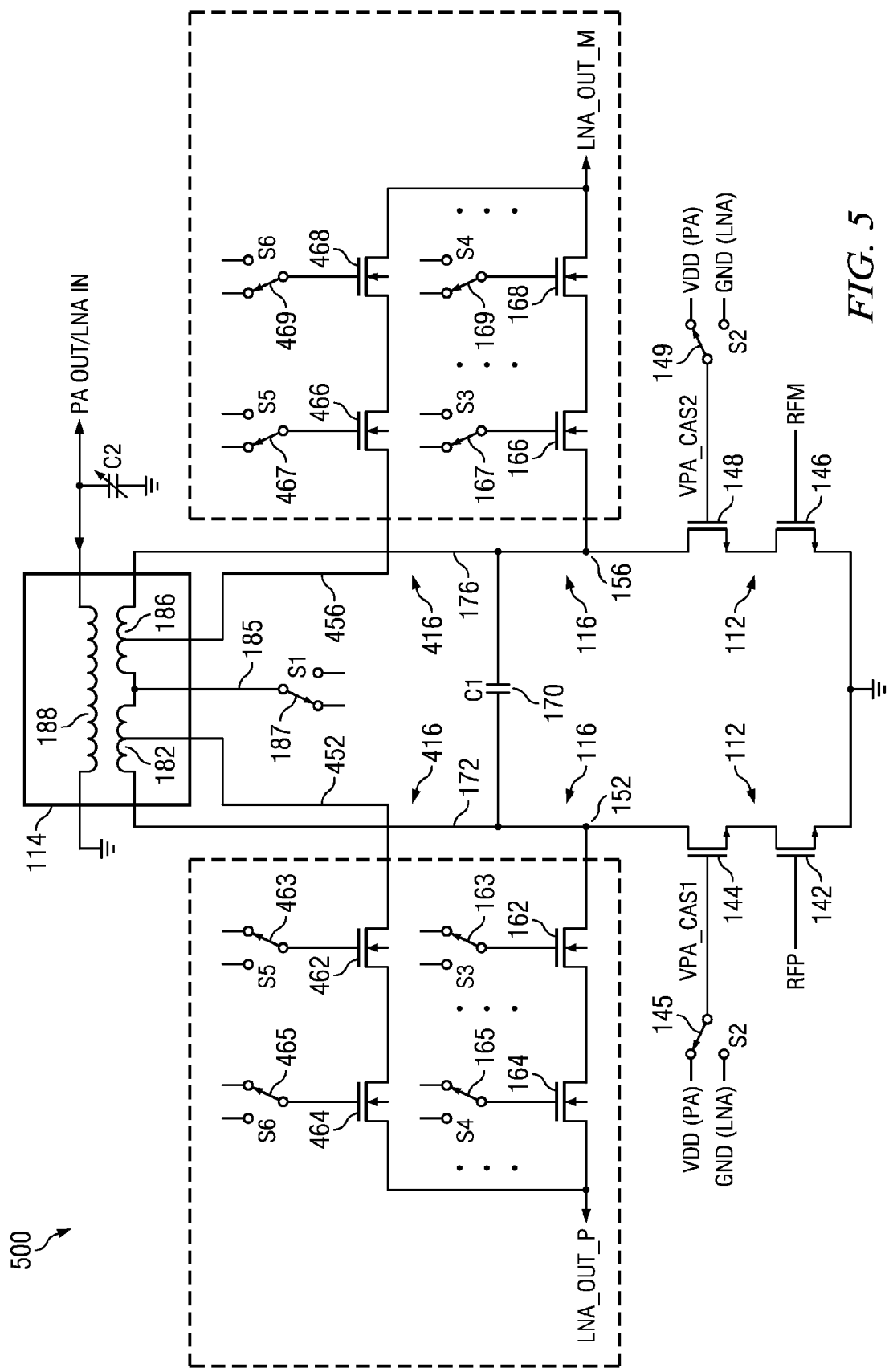
FIG. 5 is a schematic diagram of an inventive integrated RF front end with T/R switch elimination and LNA gain switching and programmability and other inventive features.
Figure 8:
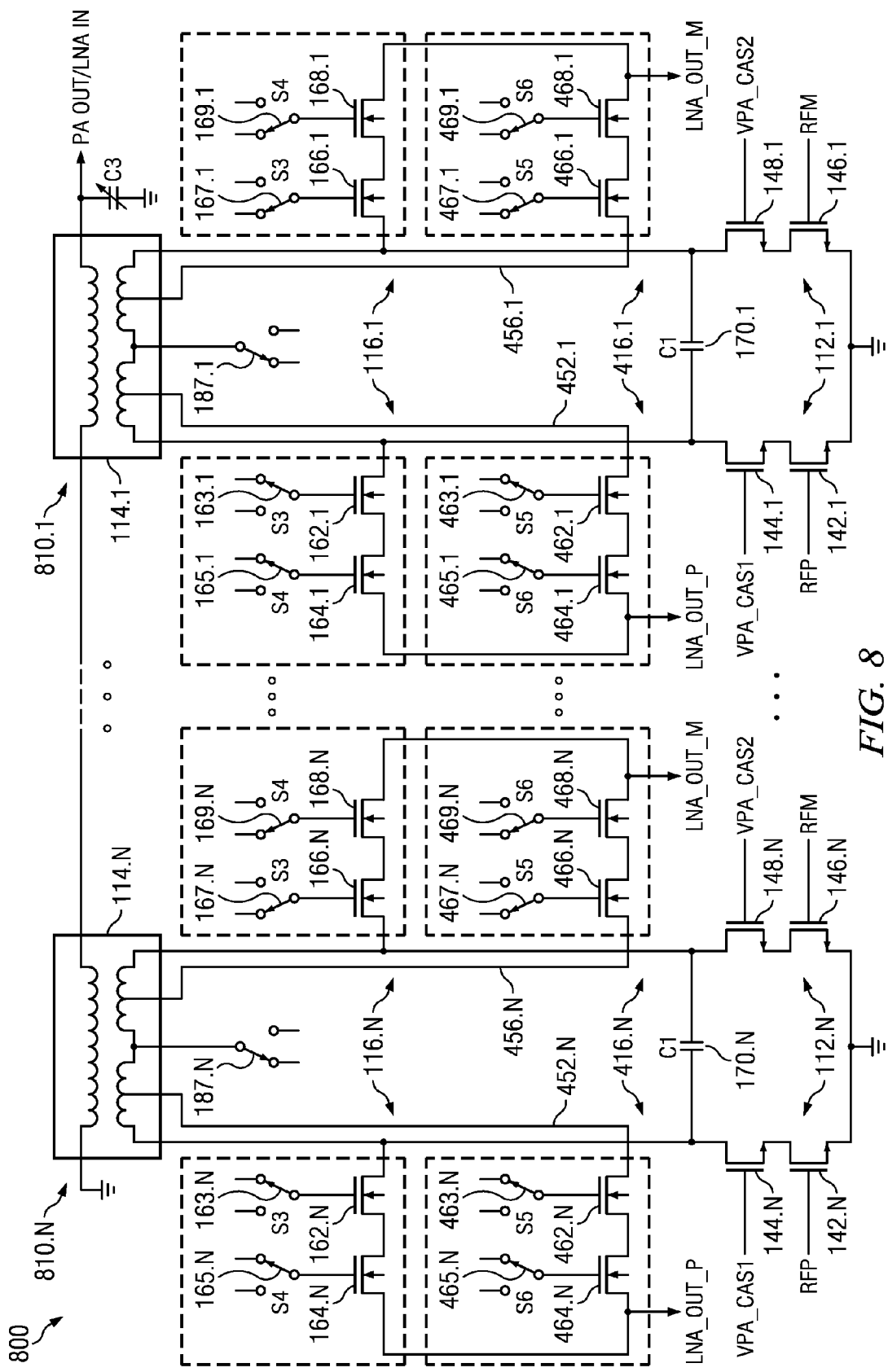
FIG. 8 is a schematic diagram of another inventive integrated RF front end for increased transmit power and receiver signal-to-noise ratio and LNA gain switching and programmability and other inventive features.

An alternative control approach is shown in TABLE 2A and FIGS. 4A/4B. Here, different power voltages for PA and LNA are accommodated. In receive mode LNA buffer transistors 162, 164, 166, 168 have their gates energized a when LNA1MODE is active, and they are shut off when LNA1MODE is inactive low. The interior tap LNA buffer transistors 462, 464, 466, 468 in FIG. 5 have their gates energized a when LNA2MODE is active, and they are shut off when LNA2MODE is inactive low. To implement the control approach of TABLE 2A, the circuitry depicted in FIG. 4A is modified and provided with a first OR-gate 366 (not shown) to separately drive the PA MODE lines of switches 163, 165, 167, 169. OR-gate 366 has a first input driven by AND gate 352 and a second input driven by LNA2MODE so that when LNA2MODE is active and LNA1MODE is inactive, the switch transistors of switches 163, 165, 167, 169 are affirmatively shut off. A second OR-gate 368 (further-provided, not shown) separately drives the PA MODE lines of switches 463, 465, 467, 469 (FIGS. 5 and 8). OR-gate 368 has a first input driven by AND gate 352 and a second input driven by LNA1MODE so that when LNA1MODE is active and LNA2MODE is inactive, the switch transistors of switches 463, 465, 467, 469 are affirmatively shut off.

TABLE 2A

MODES OF OPERATION AND OF CONTROL CIRCUITRY

| Mode | S1 | S2 | S3 | S4 | S5 | S6 |
|---|---|---|---|---|---|---|
| PA | VDD(PA) | VDD(PA) | VDD(PA) | GND(PA) | VDD(PA) | GND(PA) |
| LNA1 | GND(LNA) | GND(LNA) | VBIAS(LNA) | VDD(LNA) | VDD(PA) | GND(PA) |
| LNA2 | GND(LNA) | GND(LNA) | VDD(PA) | GND(PA) | VBIAS(LNA) | VDD(LNA) |

Still another control alternative controls switches to deliver voltages according to TABLE 2B or otherwise for the transistor types involved and the operations performed. Notice that switches S3 and S5 are designed and controlled for three-way selection of VDD, GND, and VBIAS. Some other embodiments use multiplexers to route two or more voltages to one or more PA's and LNA's.

TABLE 2B

MODES OF OPERATION AND OF CONTROL CIRCUITRY

| Mode | S1 | S2 | S3 | S4 | S5 | S6 |
|---|---|---|---|---|---|---|
| PA | VDD | VDD | VDD | GND | VDD | GND |
| LNA1 | GND | GND | VBIAS | VDD | GND | VDD |
| LNA2 | GND | GND | GND | VDD | VBIAS | VDD |

Also, the transistor types for FIGS. 4A/4B are chosen to accomplish the described operations and can be different from those shown. Compared to the integrated RF front end circuit 300 of FIG. 3, some embodiments have VDD(PA) and VDD(LNA) each reversed in polarity and the transistor type of the PA and LNA transistors is also reversed. Then, compared to FIGS. 4A and 4B, the power switching circuitry 400 in such embodiments also has the transistor type of the transistors reversed to control the voltages that are reversed in polarity.

Some embodiments can achieve functionality without a switch 187 between supply rails and center tap (i.e. only a supply voltage fed to center tap) by using p type devices for LNA and n type devices for PA (or n type devices for LNA and p type devices for PA instead). This transistor-type alternative lacking switch 187 on the center tap may deliver less performance on criteria of high transmit power and low LNA noise than switching the center tap as in FIG. 3 in some materials systems and IC transistor designs. Accordingly, the skilled worker takes account of such power and noise criteria given particular system objectives for a given design in determining whether such embodiments are to be implemented.

In FIG. 5, a PA-plus-LNA circuit embodiment 500 provides LNA gain switching and programmability for WLAN and/or other telecommunications applications. Two LNA tap sections are provided. The first LNA tap section is exteriorly connected to balun 114 via lines 172 and 176 as in FIG. 3 and has LNA transistors 162, 164, 166, 168 with supporting switches 163, 165, 167, 169. The second LNA tap section is interiorly connected to balun 114 via lines 452 and 456 in FIG. 5 and has analogously-numbered LNA transistors 462, 464, 466, 468 with supporting switches 463, 465, 467, 469. In FIG. 5, all components having same numerals as in FIG. 3 operate the same way as in FIG. 3, and all added tap section components in FIG. 5 having analogous 4xx numerals operate in an analogous manner to those components with corresponding 1xx numerals in FIG. 3.

In the FIG. 5 gain programming, the control switching of FIGS. 4A/4B enables one at a time of the LNA tap sections so that the LNA transistors for the selected tap section are operative. LNA outputs are either shorted (connected) together to form single LNA with multiple gain stages or kept separate to form multiple outputs. In FIG. 5, the circuit is extended to perform LNA Gain Programming or to have multiple LNA and PA's connected to the same balun transformer (or other type of input/output port). The primary PA side of the balun 114 is implemented as multi-tap. The usage of "multi-tap" herein includes the illustrated embodiment with balanced tap lines 172/176 and 452/456, as well as embodiments with one or more pairs of additional interior taps in addition to tap lines 452/456. A specific tap (i.e., balanced tap pair) is selected to achieve desired LNA gain and does not add extra noise.

Figure 7:
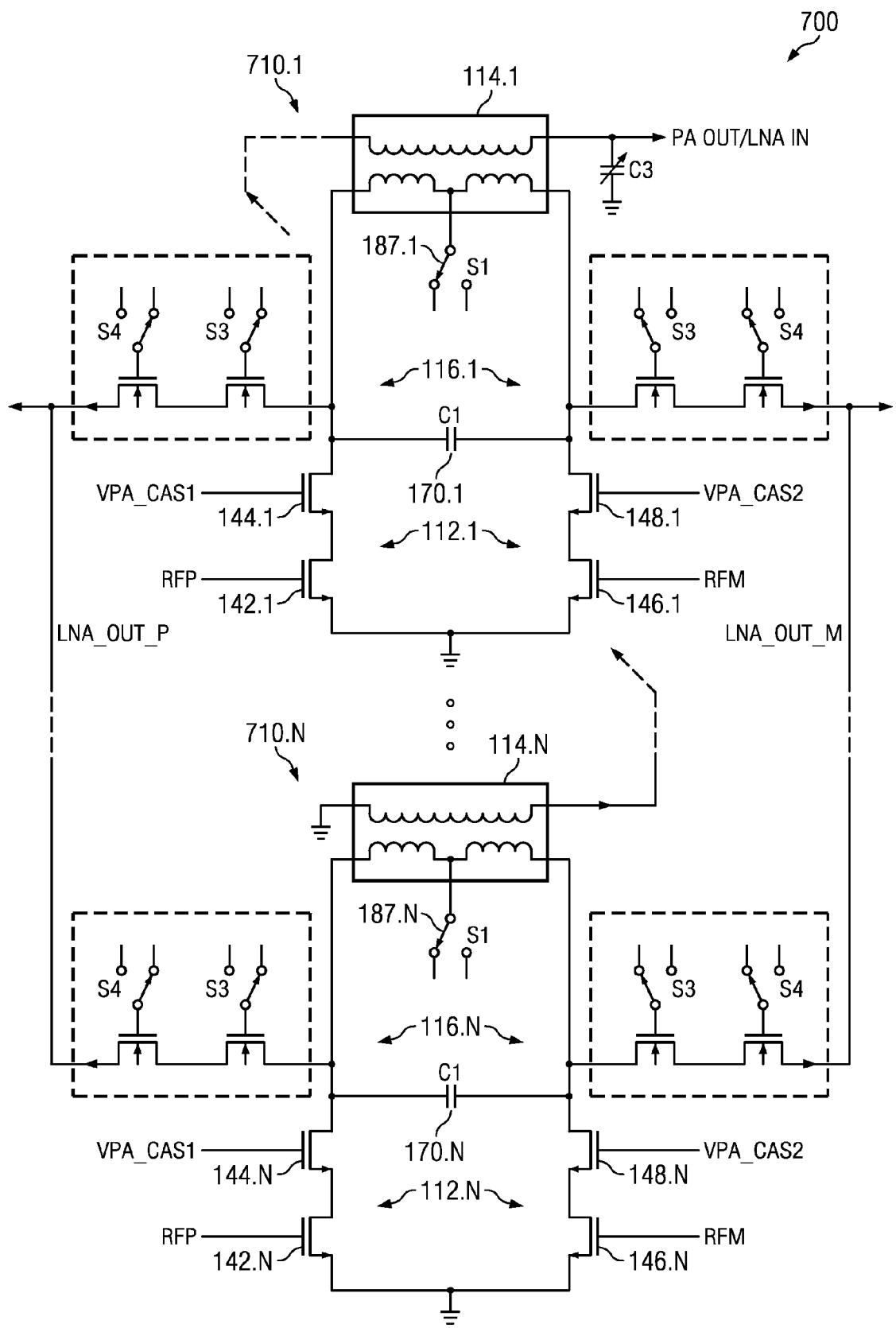
FIG. 7 is a schematic diagram of another inventive integrated RF front end for increased transmit power and receiver signal-to-noise ratio.

Implicitly indicated voltage inputs for VDD(LNA), GND (PA), VBIAS(LNA), VDD(PA) from FIG. 4A to the various switches on FIGS. 5, 7 and 8 are labeled in corresponding row-wise label order as order of labels on FIG. 3. In FIGS. 5, 7 and 8, the S# labels and switch positions on the left-side LNA transistors and S# labels and switch positions on right-side transistors make the right and left sides of the diagrams bilaterally symmetrical and correspond to switch position arrows in FIG. 3. In multi-tap FIG. 5, disabling the switches used in one row or tap section reduces the number of operable LNA transistor rows when desired. In FIG. 4A switches, some embodiments support multi-tap FIG. 5 circuit 500 by providing a replicated set of voltage switches 463, 465, 467, 469 controlling a second tap section and controlled by AND-gate 364 output LNA2MODE but otherwise identically connected and constructed the same as the switches 163, 165, 167, 169. Still other embodiments have still further balun taps and LNA tap sections each with its replicated set of voltage switches x63, x65, x67, x69 controlling a respective tap section i and controlled by an output LNAiMODE from appropriate control logic but otherwise identically connected and constructed the same as the switches 163, 165, 167, 169.

In FIGS. 5, 7 and 8, the balanced LNA section transistor outputs on each side are connected directly to each other, e.g., x64 to LNA_OUT_P or x68 to LNA OUT M. In FIGS. 5 and 8, the LNA sections connected to the balun ends or to the balun taps suitably have different input impedances depending on the connection to the balun ends or taps. The desired LNA impedance for each LNA tap section is established for the common-gate LNA circuitry shown by recognizing that the input impedance $Z_{in}$ offered by an LNA tap section is 1/transconductance of LNA transistor 162 (or 462). Accordingly, each LNA tap section impedance is respectively established or varied by establishing or changing the respective size of LNA transistor 162 (462) and/or VBIAS(LNA) to set the DC current through LNA transistor 162 (462) and thereby determine its transconductance. LNA transistor 166 is suitably sized the same as LNA transistor 162, and LNA transistor 466 is suitably sized the same as LNA transistor 462. Some embodiments use the same bias voltage for each LNA tap section, and some other embodiments apply different tap-section-specific voltages VBIASi(LNA).

In multi-tap FIG. 5, the LNA taps (in multitap or multigain cases) have two states: 1) OFF in PA mode or when the particular LNA tap/gain setting is not desired, and 2) ON—in LNA mode when the particular LNA tap/gain section is desired. The schematic diagram switch arrows are arranged in each of FIGS. 3, 5, 6, 7 and 8 to depict and indicate the PA 112 is on. To turn LNA 116 on, the arrows for one tap section or row of transistors pertaining to a given tap (not both rows) are reversed in direction relative to the directions shown. In the supporting switch circuitry of FIG. 4A, AND-gates 362 and 364 have different inputs (inverting/non-inverting) to cause control signals LNA1MODE and LNA2MODE to operate oppositely in response to input control line C_LNA1MODE provided inverter 354 control line C_LNA MODE is active high. In other words, the switching circuitry 400 has control lines LNA1MODE and LNA2MODE responsive to control input C_LNA1MODE for selectively activating either receiver RF amplifier 116 or second RF receiving amplifier 416 provided RF amplifier 112 is inactivated.

Logic is thus connected to the control inputs in the switch circuitry 400 of FIGS. 4A and 4B to handle not only PA/LNA alternatingly but also each LNA tap selection for multi-tap control in FIG. 4A. The voltage states on input control lines C_PA MODE and C_LNA1MODE are suitably coupled from and established by corresponding bits in a control register 350 written, read and operated by a controlling processor such as in FIG. 10 or a state machine, gate array, memory-based device or other control circuit. Some embodiments simply hardwire C_LNA1MODE to a high or low voltage state useful for a particular communications application or product generation. Some embodiments operate C_PA MODE with an uncomplicated circuit to alternately establish transmit mode or receive mode.

Figure 6:
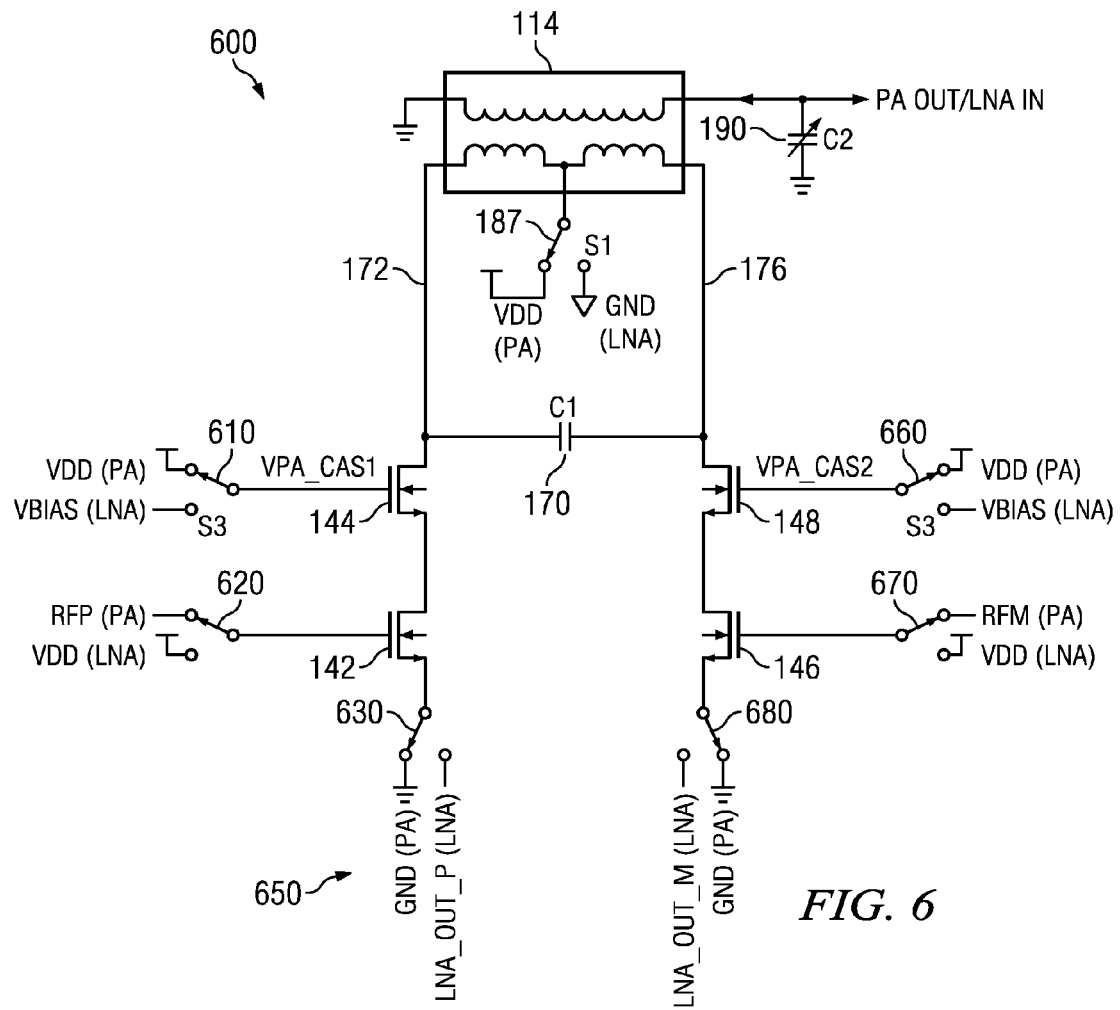
FIG. 6 is a schematic diagram of another inventive integrated RF front end utilizing the same transistors for transmit and receive.

In FIG. 6, the same transistors 142, 146 and 144, 148 operate in different balanced operating modes as either a PA or LNA in an alternative circuit embodiment 600. FIG. 6 shows the PA-plus-LNA circuit 600 with same transistors used for LNA and PA for WLAN, cellular or other telecommunications. Also in FIG. 6, the same transistor 144 (148) is used as both a power amplifier output transistor (as in FIG. 3) and re-used as an LNA input transistor (analogous to FIG. 3 transistor 162 (166)). This approach of double use or reuse reduces extra routing and real estate in the chip layout and reduces associated signal and power loss. Thus the FIG. 6 transistors 144, 148 act as balanced current buffer PA 112 output devices or as transconductors (voltage to current converter) as if in the FIG. 3 LNA 116 balanced RF amplifier. Further in FIG. 6, the same transistor 142, 146 is used as both a PA 112 input amplifier transistor (as in FIG. 3) and re-used as an LNA output buffer transistor (analogous to transistor 164 (168)).

Control circuitry 650 in FIG. 6 is provided analogous to control circuitry 400 of FIGS. 4A and 4B and adapted so that the FIG. 6 control circuitry 650 has switches 187, 610 and 660, 620 and 670, and 630 and 680 connected and operable for switching functions as shown and described for FIG. 6. Interlock and control circuitry, such as shown in FIG. 4A with logic 352, 354, 356 and 362 or otherwise, is suitably applied in FIG. 6 control circuitry 650.

In FIG. 6 transmit mode, the gates for PA inputs of transistors 142, 146 are coupled to FIG. 2 PPA 111 outputs RFP and RFM by switches 620, 670. The sources of transistors 142, 146 are grounded to GND(PA) by switches 630, 680 on transmit. The VPA-CAS transistors 144, 148 in PA 112 are operated as a balanced PA buffer with the gates coupled to voltage VDD(PA) by switches 610, 660.

In FIG. 6 receive mode the gates for PA inputs of transistors 142, 146 are instead held high to VDD(LNA) by switches 620, 670. Also, the sources of transistors 142, 146 are connected to the LNA outputs LNA OUT_P and LNA_OUT_M by switches 630, 680 to operate transistors 142, 146 as LNA output buffers on receive. The VPA-CAS transistors 144, 148 in PA 112 are operated as a balanced LNA transconductor with their gates connected to voltage VBIAS(LNA) by switches 610, 660.

In this way electronic circuit 600 is constructed to be an example of a transistor-based RF (radio frequency) power amplifier having balanced outputs 172, 176 and sharing transistors 142, 144, 146, 148 with a transistor-based receiver RF amplifier having balanced inputs identical with the balanced outputs 172, 176 of the RF power amplifier respectively. Balun 114 has its primary connections ohmically connected to the balanced outputs 172, 176 of the RF power amplifier respectively thereby to couple both supply current and RF between the balun 114 and the shared transistors of the RF power amplifier and said receiver RF amplifier. The switching circuitry 610, 620, 660, 670 variously activates the shared transistors to enable the RF power amplifier or receiver RF amplifier, and further switching circuitry 630, 680 switch a pair 142, 146 of the shared transistors between the GND(PA) supply rail for RF power amplifier and output lines LNA_OUT_P, LNA_OUT_M for receiver RF amplifier.

In FIG. 6, the connections, the nominal design values and the operation of balun 114, capacitor 170, lines 172 and 176, switch 187 and capacitor 190 are substantially the same as hereinabove-described in connection with FIG. 3. Balun 114 center tap is energized by voltage VDD(PA) through switch 187 on transmit, and grounded to GND(LNA) through switch 187 on receive. Analogous to FIG. 5, one or more interior balun tap pairs are provided in some FIG. 6 embodiments. LNA tap section(s) transistors 462, 464 are connected between an interior balun tap and an LNA_OUT_P line of switch 630 and transistors 466, 468 are connected between an oppositely corresponding interior balun tap and LNA_OUT_M line of switch 680. Control switching in a multi-tap embodiment for FIG. 6 is similar to that described for LNA2MODE in FIGS. 4A and 5 and adapted for such a multi-tap embodiment of FIG. 6.

Operating circuits 300 and 600 is similar in that an operational process splits and couples supply current along balanced lines 172, 176 to balanced outputs of an RF power amplifier and balanced inputs of a receiver RF amplifier, and alternately either RF power amplifies on transmit or RF transconducts on receive switchlessly on the balanced lines. In both FIGS. 3 and 6, switching between DC supply rails by switch 187 comes ahead of the current splitting in the balun 114 primary. The FIG. 6 process, moreover, shares transistors 144, 142 and 148, 146 for the RF power amplifier and the receiver RF amplifier between the balanced lines 172, 176. The diagrams of FIGS. 3 and 6 also depict the flows of their operating processes.

In FIGS. 7 and 8, a multi-input single output Power Combiner is used in circuit embodiments 700 and 800 respectively when more power is to be accommodated and to meet desired reliability. In this way, embodiments 700 and 800 are adapted and extended to accommodate cellular telecommunication power levels. Circuit embodiment 700 has transmit/receive sections 710.1, . . . 710.N each analogous in structure and operation to circuit embodiment 300 of FIG. 3. Circuit embodiment 800 has multi-tap transmit/receive sections 810.1, . . . 810.N each analogous in structure and operation to circuit embodiment 500 of FIG. 5.

In FIG. 7, the PA-plus-LNA circuit embodiment 700 has both a Power Combiner including balun sections 114.1, . . . 114.N driven by multiple PA's 112.1, . . . 112.N for cellular applications together with LNA structure 116.1, . . . 116.N for cellular applications. In FIG. 8, the PA-plus-LNA circuit embodiment 800 also has a Power Combiner including balun sections 114.1, . . . 114.N driven by multiple PA's 112.1, . . . 112.N for cellular applications. The LNA structure 116.1, . . . 116.N for cellular applications is augmented for programmable-gain multi-tap structure and operation by additional pairs of balun interior tap lines 452.1, 456.1; . . . 452.N, 456.N respectively coupled to additional rows of LNA tap section transistors 462.1, 464.1, 466.1, 468.1; . . . 462.N, 464.N, 466.N, 468.N. Each of the rows of LNA tap section transistors is connected and operates in a manner analogous to that shown in FIG. 5. The power switching circuitry of FIGS. 4A and 4B is replicated and adapted to connect with and operate the circuitry of FIG. 7 and FIG. 8. The switching circuit for operating the circuitry of FIG. 7 and FIG. 8 alternately enables the RF power amplifiers 112.1, . . . 112.N in tandem or the receiver RF amplifiers 116.1, . . . 116.N in tandem or the LNA tap section second RF receiving amplifiers 416.1, . . . 416.N in tandem.

Multi-tap FIG. 8 has the circuit embodiment 700 of FIG. 7 included as a subset of the circuitry 800 in FIG. 8. In this way, parallel LNA output connections to LNA_OUT_P and LNA_OUT_M in both FIGS. 7 and 8 for the circuit 700 subset are more clearly shown in FIG. 7. Further, FIG. 8 more clearly shows the series-connection of antenna-side balun secondaries of both FIGS. 7 and 8, each secondary analogous to secondary 188 of FIG. 3.

In FIG. 7, all components having numerals left of decimal point same as the three digit numerals in FIG. 3 operate together in the synergistic manner described for FIG. 7 and also as described for FIG. 3. In FIG. 8, all components having numerals left of decimal point same as the three digit numerals in FIG. 3 or 5 operate in the synergistic manner described for FIGS. 8 and/or 7 and also as described for FIG. 3 or 5.

In FIGS. 7 and 8, the PA-plus-LNA circuit embodiment 700 has the Power Combiner for cellular applications established by a balun transformer with N cascaded (series-connected) antenna-side secondaries and with N center-tapped primaries each connected to a corresponding PA 112.i and energized for transmit mode or grounded for receive mode by a respective power switch 187.i. Tap selection is accomplished in tandem, for instance, so that all the LNA balanced tap sections 4xx.i for the interior tap are connected and activated in parallel and otherwise all the LNA balanced tap sections 1xx.i for the exterior tap are connected and activated in parallel instead.

In FIGS. 7 and 8, improvement in signal-to-noise ratio SNR is achieved by using this parallel LNA circuit arrangement. This can be understood by considering the different sections 710.1-710.N or 810.1-810.N as having independent LNA's with their current outputs added. Signal addition happens in-phase (as addition because all the LNA's get their input signal at the same phase). By contrast, noise addition happens in random phases (power addition) at the LNA output. As a result, for instance, adding two LNA current outputs increases the signal at the balanced LNA outputs LNA_OUT_P and LNA_OUT_M by 6 dB but increases the noise by only 3 dB thereby effectively giving 3 dB better SNR (6 dB minus 3 d of B).

In FIGS. 7 and 8, on the PA Output/LNA Input antenna side of the Power Combiner, each of the balun stages 114.i has its M:1 balun transformer secondary connected in series. The value of variable capacitance C3 in FIGS. 7 and 8 is reduced at same frequency relative to variable capacitance C2 in FIG. 3. In some embodiments, antenna impedance in FIGS. 7 and 8 is made higher than in FIG. 3 to perform impedance match. Higher antenna voltage in FIGS. 7 and 8 maintains same antenna-side balun current as in FIG. 3. In other embodiments, antenna impedance is kept same in FIGS. 7, 8 and 3 by scaling individual baluns 114.i in FIGS. 7 and 8. For instance, with three balun sections 114.i in FIG. 7, each of the balun inductance values is suitably scaled by three (3) from the corresponding balun inductance in FIG. 3. Current in the balun top side (antenna side) is then same as in FIG. 3 while current addition is still effective the parallelized LNA tap sections. In FIGS. 7 and 8, on the balun LNA side (lower-side), current addition of LNAs occurs with LNA currents that are also each just as large as in FIG. 3 and thus improves current-signal to noise ratio on the outputs LNA_OUT P and LNA_OUT M. LNA current outputs are combined at the LNA_OUT-M or LNA_OUT_P terminals with separate LNA's for each tap.

In power combiner FIG. 7, outputs for the LNA transistors are connected Right side to Right and Left side to Left to ensure LNA output currents of same polarity are added together. Right side LNA transistors are connected to a right side LNA_OUT M and the left side LNA transistors are connected to a left side LNA_OUT P. The composite LNA benefits from current summation by adding two currents of equal magnitude and same phase to deliver a resultant current of double the magnitude but not proportionally as much noise.

In some other embodiments, the single or multi-tap circuitry described in connection with FIG. 6 is substituted into either FIG. 7 or FIG. 8 in place of the circuits of FIG. 3 or FIG. 5 to even more economically utilize chip real estate.

Figure 9:
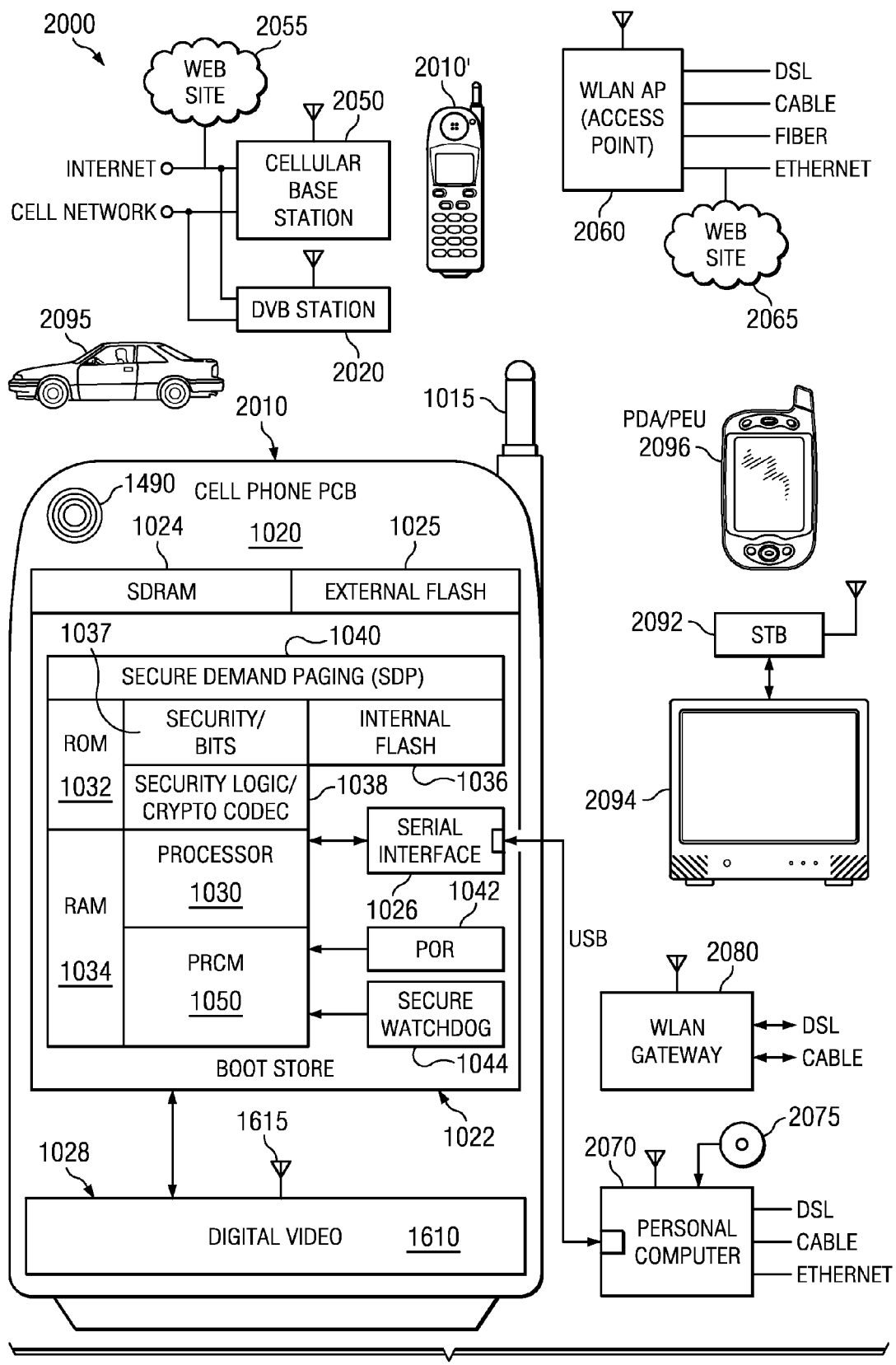
FIG. 9 is a pictorial diagram of a communications system embodiment including system blocks, for example a cellular base station, a DVB video station, a WLAN AP (wireless local area network access point), a WLAN gateway, a personal computer, a set top box and television unit, and two cellular telephone handsets, any one, some or all of the foregoing inventively improved as in the other Figures.

In FIG. 9, an improved communications system 2000 has system blocks as described next and improved with any one, some or all of the circuits and subsystems shown in various other Figures of the drawing. Any or all of the system blocks, such as cellular mobile telephone and data handsets 2010 and 2010', a cellular (telephony and data) base station 2050, a WLAN AP (wireless local area network access point, IEEE 802.11 or otherwise) 2060, a Voice over WLAN Gateway 2080 with user voice over packet telephone 2085 (not shown), and a voice enabled personal computer (PC) 2070 with another user voice over packet telephone (not shown), communicate with each other in communications system 2000.

Camera 1490 provides video pickup for cell phone 2010 to send over the internet to cell phone 2010', personal digital assistant/personal entertainment unit PDA/PEU 2096, TV 2094, automobile 2095 and to a monitor of personal computer PC 2070 via any one, some or all of cellular base station 2050, DVB station 2020, WLAN AP 2060, set top box STB 2092, and WLAN gateway 2080. Handset 2010 has a video storage and other storage, such as hard drive, flash drive, high density memory, and/or compact disk (CD) in the handset for digital video recording (DVR) such as for delayed reproduction, transcoding, and retransmission of video to other handsets and other destinations.

On a cell phone printed circuit board (PCB) 1020 in handset 2010, is provided a higher-security processor integrated circuit 1022, an external flash memory 1025 and SDRAM 1024, and a serial interface 1026. A Power, Resets and Control Module PRCM 1050 (1185, 1470 of FIG. 10) is provided for smart power management. Serial interface 1026 is suitably a wireline interface, such as a USB interface connected by a USB line to the personal computer 2070 and magnetic and/or optical media 2075. Cell phone 2010 intercommunication also occurs via a cellular modem, WLAN, Bluetooth and/or otherwise and from a website 2055 or 2065, television and physical layer (PHY) or other circuitry 1028. Processor integrated circuit 1022 has MPU (or CPU) block 1030 coupled to an internal (on-chip read-only memory) ROM 1032, an internal RAM 1034, and flash memory 1036. A security logic circuit 1038 is coupled to secure-or-general-purpose-identification value (Security/GPI) bits 1037 of a non-volatile one-time alterable Production ID register or array of electronic fuses (E-Fuses). Depending on the Security/GPI bits, boot code residing in ROM 1032 responds differently to a Power-On Reset (POR) circuit 1042 and to a secure watchdog circuit 1044 coupled to processor 1030.

Figure 10:
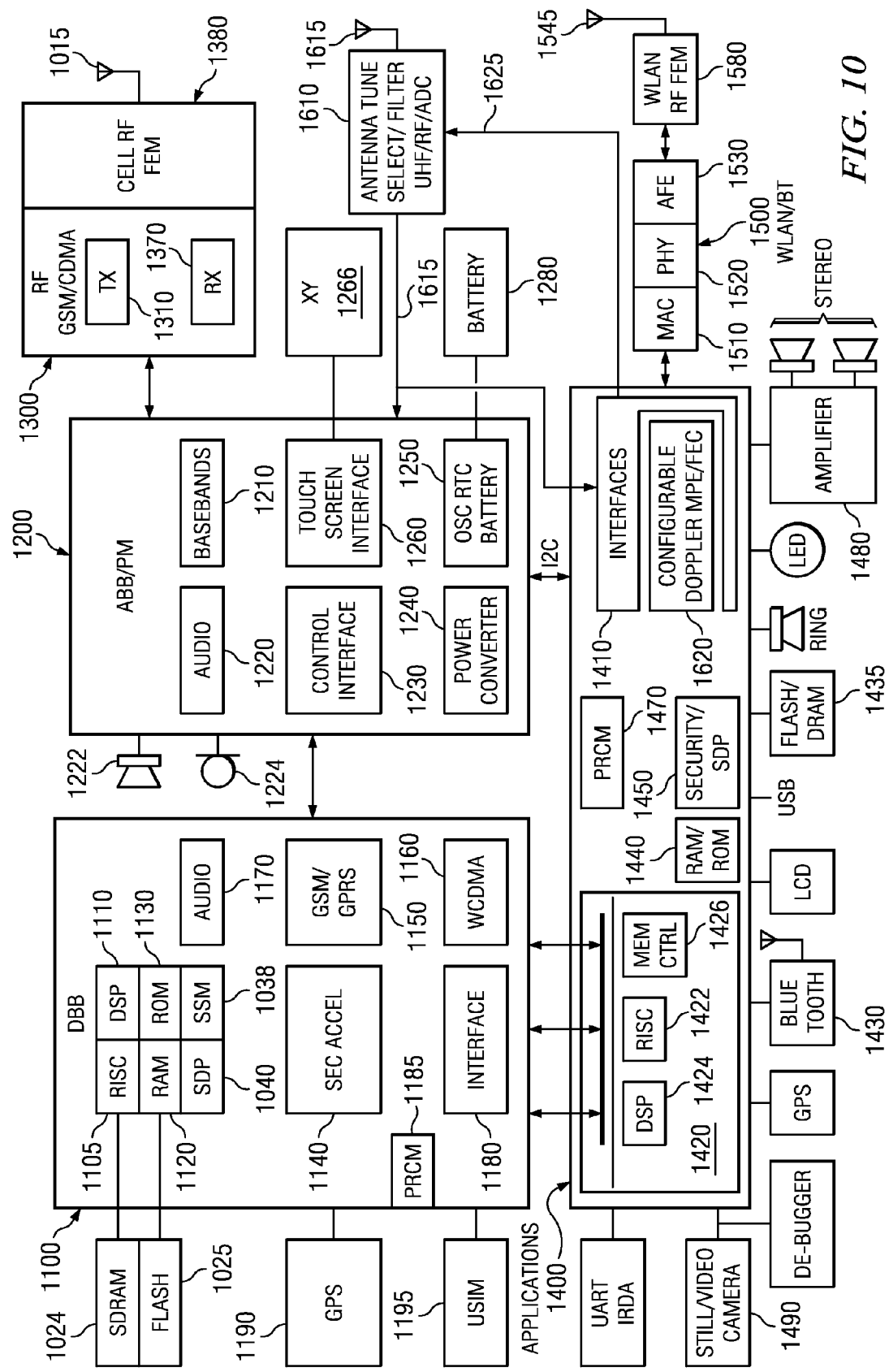
FIG. 10 is a block diagram of inventive integrated circuits for use in the blocks of the communications system of FIG. 9 including the inventive circuits and methods of operation of any of the other Figures.

In FIG. 10, handset 2010 has an integrated circuit 1100 that includes a digital baseband (DBB) block that has a RISC processor 1105 and a digital signal processor 1110, communications and security software, and security accelerators 1140. A memory controller interfaces the RISC core 1105 and the DSP core 1110 to Flash memory 1025 and SDRAM 1024. On chip RAM 1120 and on-chip ROM 1130 also are accessible to the processors 1105 and 1110 for providing sequences of software instructions and data thereto. A security logic circuit 1038 of FIGS. 9 and 10 has a secure state machine (SSM) to provide hardware monitoring of any tampering with security features. A Secure Demand Paging (SDP) circuit 1040 is provided for effectively-extended secure memory.

Digital circuitry 1150 on integrated circuit (IC) 1100 supports and provides wireless interfaces for any one or more of GSM, GPRS, EDGE, UMTS, and OFDMA/MIMO embodiments. Digital circuitry 1160 provides codec for CDMA (Code Division Multiple Access), CDMA2000, and/or WCDMA (wideband CDMA or UMTS) wireless suitably with HSDPA/HSUPA (High Speed Downlink Packet Access, High Speed Uplink Packet Access) (or 1×EV-DV, 1×EV-DO or 3×EV-DV) data feature via the analog baseband chip 1200 and RF GSM/CDMA chip 1300. Audio/voice block 1170 supports audio and speech/voice functions and interfacing. Speech/voice codec(s) and user voice-recognition/voice control are suitably provided in memory space in audio/voice block 1170 for processing by processor(s) 1110. Applications interface 1180 couples the digital baseband 1100 to applications processor 1400. Power resets and control module (PRCM) 1185 provides power management circuitry for integrated circuit (IC) chip 1100. IC chip 1100 is coupled to location-determining circuitry 1190 for GPS (Global Positioning System). IC 1100 is also coupled to a USIM (UMTS Subscriber Identity Module) 1195.

In FIG. 10, a mixed-signal integrated circuit 1200 includes an analog baseband (ABB) block 1210 for GSM/GPRS/EDGE/UMTS/HSDPA/HSUPA and an analogous ABB for CDMA wireless and any associated 1×EV-DV, 1×EV-DO or 3×EV-DV data and/or voice with its respective SPI (Serial Port Interface), digital-to-analog conversion DAC/ADC block, and RF Control pertaining to CDMA and coupled to RF (CDMA) chip 1300. An audio block 1220 has audio I/O (input/output) circuits to a speaker 1222, a microphone 1224, and headphones (not shown). A control interface 1230 has a primary host interface (I/F) and a secondary host interface to DBB-related integrated circuit 1100 for the respective GSM and CDMA paths.

A power conversion block 1240 includes buck voltage conversion circuitry for DC-to-DC conversion, and low-dropout (LDO) voltage regulators for power management/sleep mode of respective parts of the chip supplied with voltages VDDx regulated by the LDOs. Power conversion block 1240 provides information to and is responsive to a power control state machine between the power conversion block 1240 and circuits 1250 for clocking chip 1200. A touch screen interface 1260 is coupled to a touch screen XY 1266 off-chip for display and control. Battery 1280 provides power to the system and battery data to circuit 1250 on suitably provided lines from the battery pack.

In FIG. 10 an RF integrated circuit 1300 includes a GSM/GPRS/EDGE/UMTS/CDMA/MIMO-OFDMA RF transmitter block 1310 fed by baseband block 1210 of chip 1200, and Transmitter 1310 drives a dual band RF cellular telecommunications RF front-end module 1380 coupled to one or more antennas 1015 (110, 120, 119 in FIG. 2). Antenna 1015 is coupled to PA(s) and LNA(s) (low noise amplifiers) as described elsewhere herein and depicted in FIGS. 2-8. The cellular telephone handset 2010 thus has any of user interface transducers 1222, 1224, 1266, other displays and other user interface transducers ultimately coupled to that plurality of electronic circuits of FIGS. 2-8. LNA(s) couples to GSM/GPRS/EDGE/UMTS/CDMA demodulator 1370 to produce I/Q (in-phase, quadrature outputs) to baseband block 1210. Replication of blocks and antennas is provided in a cost-efficient manner to support MIMO OFDMA embodiments.

Chip 1400 has an applications processing section 1420 RISC processor 1422 (such as MIPS® core(s), ARM® core(s), or other suitable processor), a digital signal processor 1424, and a shared memory controller MEM CTRL 1426 with DMA (direct memory access), and a 2D/3D graphic accelerator. Speech/voice codec functionality is processed. Off-chip memory resources 1435 include DRAM and flash memory. Shared memory controller 1426 interfaces the RISC processor 1422 and the DSP 1424 via an on-chip bus to on-chip memory 1440 with RAM and ROM. Security logic 1038 of FIGS. 9 and 10 (1038, 1450) includes hardware-based protection circuitry, also called security monitoring logic or a secure state machine SSM to monitor busses and other parts for security violations. A JTAG emulation interface couples to an off-chip emulator Debugger, I2C interfaces to analog baseband ABB chip 1200, and an interface couples to applications interface 1180.

DLP™ display technology from Texas Instruments Incorporated is coupled to interface 1410 or otherwise as convenient. A transparent organic semiconductor display is provided on one or more windows of the vehicle 2095 of FIG. 1 and wirelessly or wireline-coupled to the video feed.

In FIG. 10, a WLAN and/or WiMax integrated circuit 1500 includes MAC (media access controller) 1510, PHY (physical layer) 1520 and AFE (analog front end) 1530. AFE 1530 is bidirectionally coupled for transmit and receive to fully-integrated WLAN RF front-end module as shown in any one, some or all of FIGS. 2-8 herein. A MIMO UWB (ultra wide-band) MAC/PHY supports OFDM in 3-10 GHz. UWB bands. communications in some embodiments. A digital video integrated circuit 1610 provides television antenna 1615 tuning, antenna selection, filtering, and RF input stage for recovering video/audio/controls from DVB station 2020 of FIG. 22.

The voltage states on FIG. 4A input control lines C_PA MODE and C_LNA1MODE, and any further desired input control lines are suitably coupled from and established by corresponding bits in a control register written, read and operated by any controlling processor in FIG. 10. Such controlling processor is suitably situated in WLAN/BT unit 1500, or is provided such as the RISC processor 1422 or DSP 1424 in application processing chip 1400, or the RISC processor 1105 or DSP 1110 in digital baseband 1100. Still other system devices such as those depicted or described in connection with FIG. 9 are provided with the circuitry and controls of the other Figures herein.

Various embodiments are used with one or more microprocessors, each microprocessor having a pipeline is selected from the group consisting of 1) reduced instruction set computing (RISC), 2) digital signal processing (DSP), 3) complex instruction set computing (CISC), 4) superscalar, 5) skewed pipelines, 6) in-order, 7) out-of-order, 8) very long instruction word (VLIW), 9) single instruction multiple data (SIMD), 10) multiple instruction multiple data (MIMD), 11) multiple-core using any one or more of the foregoing, and 12) microcontroller pipelines, control peripherals, and other microcontrol blocks using any one or more of the foregoing.

Processing circuitry comprehends digital, analog and mixed signal (digital/analog) integrated circuits, ASIC circuits, PALs, PLAs, decoders, memories, and programmable and nonprogrammable processors, microcontrollers and other circuitry. Internal and external couplings and connections can be ohmic, capacitive, inductive, photonic, and direct or indirect via intervening circuits or otherwise as desirable. "Ohmic" and "ohmically" refer to a coupling that is neither primarily capacitive nor indirect. Process diagrams herein are representative of flow diagrams for operations of any embodiments whether of hardware, software, or firmware, and processes of manufacture thereof. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms "including", "includes", "having", "has", "with", or variants thereof are used in the detailed description and/or the claims to denote non-exhaustive inclusion in a manner similar to the term "comprising". The appended claims and their equivalents cover any such embodiments, modifications, and embodiments as fall within the scope of the invention.

What is claimed is:

1. An electronic circuit comprising
  a transistor-based RF (radio frequency) power amplifier having balanced outputs;
  a transistor-based receiver RF amplifier having balanced inputs ohmically connected to said balanced outputs respectively of said RF power amplifier; and
  a balun having a primary and a secondary, said primary having primary connections and a supply connection of said primary intermediate said primary connections and said primary connections ohmically connected both to said balanced outputs of said RF power amplifier respectively and to said balanced inputs of said receiver RF amplifier, thereby to switchlessly couple RF between the balun and the RF power amplifier and switchlessly couple RF between the balun and the receiver RF amplifier.

2. The electronic circuit claimed in claim 1 further comprising a switching circuit operable to alternately enable said RF power amplifier or said receiver RF amplifier.

3. The electronic circuit claimed in claim 1 further comprising a transistor switching circuit having a supply voltage connection and a supply voltage common connection, said transistor switching circuit further having a switchable connection selectively coupling substantially free of RF said supply connection of said balun primary to the supply voltage connection of said transistor switching circuit or to said supply voltage common connection.

4. The electronic circuit claimed in claim 1 wherein said RF power amplifier has a transmit signal path and a first set of transistor gates and said receiver RF amplifier has receive signal path and a second set of transistor gates, and further comprising switching circuits coupled to said first and second sets of transistor gates separate from the signal paths.

5. The electronic circuit claimed in claim 1 further comprising switching circuits operable to selectively switch a supply voltage for said RF power amplifier and switch a bias voltage for said receiver RF amplifier, said switching circuits having respective control lines responsive to a single control input.

6. The electronic circuit claimed in claim 5 further comprising a processor and a register, said single control input coupled to said register.

7. The electronic circuit claimed in claim 1 wherein said RF power amplifier has an output impedance and said receiver RF amplifier has an input impedance that at least approximately matches the output impedance of said RF power amplifier.

8. The electronic circuit claimed in claim 1 wherein said receiver RF amplifier includes a balanced transconductor having said balanced inputs.

9. The electronic circuit claimed in claim 1 further comprising a capacitor coupled across said balanced outputs of said RF power amplifier and additionally comprising an antenna switchlessly coupled across said balun secondary.

10. The electronic circuit claimed in claim 1 further comprising a second RF receiving amplifier having balanced inputs connected to a pair of interior taps of said balun primary.

11. The electronic circuit claimed in claim 10 further comprising switching circuits operable to selectively switch a supply voltage for said RF power amplifier and switch a bias voltage for said receiver RF amplifier and said second RF receiving amplifier, said switching circuits having respective control lines responsive to a single transmit/receive control input and further control lines responsive to a second control input for selectively activating either said receiver RF amplifier or said second RF receiving amplifier provided said RF amplifier is inactivated.

12. The electronic circuit claimed in claim 1 further comprising a wireless baseband coupled to said RF power amplifier and to said receiver RF amplifier.

13. The electronic circuit claimed in claim 1 further comprising a single semiconductor chip integrating together said balun, said RF power amplifier, and said receiver RF amplifier.

14. The electronic circuit claimed in claim 13 further comprising a switching circuit operable to alternately enable said RF power amplifier or said receiver RF amplifier in response to a transmit/receive control input, said switching circuit integrated into said single semiconductor chip also.

15. The electronic circuit claimed in claim 1 for use in a system selected from the group consisting of 1) WLAN, 2) cellular, 3) TDMA and 4) Bluetooth.

16. A wireless communication circuit comprising:
a plurality of electronic circuits, each including
a transistor-based RF (radio frequency) power amplifier having balanced outputs;
a transistor-based receiver RF amplifier having balanced inputs ohmically connected to said balanced outputs respectively of said RF power amplifier; and
a balun having a primary and a secondary, said primary having primary connections and a supply connection of said primary intermediate said primary connections and said primary connections ohmically connected both to said balanced outputs of said RF power amplifier respectively and to said balanced inputs of said receiver RF amplifier, thereby to switchlessly couple RF between the balun and the RF power amplifier and switchlessly between the balun and the receiver RF amplifier; and
said balun secondaries of said electronic circuits connected in series, whereby to establish a power combiner, and each said receiver RF amplifier having balanced outputs coupled in parallel with the balanced outputs of each other said receiver RF amplifier of said electronic circuits, whereby to increase signal-to-noise ratio.

17. The wireless communication circuit claimed in claim 16 further comprising a switching circuit operable to alternately enable said RF power amplifiers in tandem or said receiver RF amplifiers in tandem.

18. The wireless communication circuit claimed in claim 16 wherein each of the plurality of electronic circuits further comprises a second RF receiving amplifier having balanced inputs connected to a pair of interior taps of said balun primary.

19. The wireless communication circuit claimed in claim 18 further comprising switching circuits operable to selectively switch a supply voltage for said RF power amplifier and switch a bias voltage for each said receiver RF amplifier and each said second RF receiving amplifier, said switching circuits having respective control lines responsive to a single transmit/receive control input and further control lines responsive to a second control input for selectively activating either each said receiver RF amplifier or each said second RF receiving amplifier.

20. The wireless communication circuit claimed in claim 16 further comprising an antenna switchlessly coupled to said series-connected balun secondaries.

21. The wireless communication circuit claimed in claim 16 further comprising a single semiconductor chip integrating together said balun, said RF power amplifier, and said receiver RF amplifier of the plurality of electronic circuits.

22. The wireless communication circuit claimed in claim 21 further comprising a switching circuit operable to alternately enable said RF power amplifiers and said receiver RF amplifiers in response to a transmit/receive control input, said switching circuit integrated into said single semiconductor chip also.

23. The wireless communication circuit claimed in claim 16 further comprising a cellular telephone handset having user interface transducers coupled to said plurality of electronic circuits.

24. An electronic circuit comprising
a transistor-based RF (radio frequency) power amplifier having balanced outputs and sharing transistors with a transistor-based receiver RF amplifier having balanced inputs identical with said balanced outputs of said RF power amplifier respectively; and a balun having a primary and a secondary, said primary having primary connections and a supply connection of said primary intermediate said primary connections and said primary connections ohmically connected to said balanced outputs of said RF power amplifier respectively thereby to couple RF between the balun and the shared transistors of said RF power amplifier and said receiver RF amplifier.

25. The electronic circuit claimed in claim 24 further comprising a switching circuit operable to variously activate said shared transistors thereby to enable said RF power amplifier or said receiver RF amplifier, and a further switching circuit to switch a pair of the shared transistors between a supply rail for said RF power amplifier and output lines for said receiver RF amplifier.

26. The electronic circuit claimed in claim 24 further comprising a transistor switching circuit having a supply voltage connection and a supply voltage common connection, said transistor switching circuit further having a switchable connection selectively coupling said supply connection of said balun primary to the supply voltage connection of said transistor switching circuit or to said supply voltage common connection.

27. The electronic circuit claimed in claim 24 further comprising a second RF receiving amplifier having balanced inputs connected to a pair of interior taps of said balun primary.

28. The electronic circuit claimed in claim 27 further comprising switching circuits operable to selectively switch a supply voltage for said RF power amplifier and switch a bias voltage for said receiver RF amplifier and said second RF receiving amplifier, and to switch a pair of the shared transistors between a supply rail for said RF power amplifier and output lines for said receiver RF amplifier, said switching circuits having respective control lines responsive to a single transmit/receive control input and further control lines responsive to a second control input for selectively activating either said receiver RF amplifier or said second RF receiving amplifier.

29. The electronic circuit claimed in claim 24 further comprising an antenna switchlessly coupled to said balun secondary.

30. The electronic circuit claimed in claim 24 further comprising a single semiconductor chip integrating together said balun, and said RF power amplifier and receiver RF amplifier so combined.

31. The electronic circuit claimed in claim 30 further comprising a switching circuit operable to variously activate said shared transistors thereby to enable said RF power amplifier or said receiver RF amplifier, and a further switching circuit to switch a pair of the shared transistors between a supply rail for said RF power amplifier and output lines for said receiver RF amplifier, said switching circuits integrated into said single semiconductor chip also.

32. The electronic circuit claimed in claim 24 for use in a system selected from the group consisting of 1) WLAN, 2) cellular, 3) TDMA and 4) Bluetooth.

33. A process of electronic manufacturing comprising integrating on a single semiconductor integrated circuit chip a transistor-based RF (radio frequency) power amplifier having balanced outputs, a transistor-based receiver RF amplifier having balanced inputs ohmically connected to the balanced outputs respectively of said RF power amplifier, and a balun having a primary and a secondary, said primary having primary connections and a supply connection of said primary intermediate said primary connections and said primary connections ohmically connected switchlessly both to said balanced outputs of said RF power amplifier respectively and to said balanced inputs of said receiver RF amplifier.

34. The process claimed in claim 33 wherein the integrating includes integrating on the same semiconductor integrated circuit chip a switching circuit operable to switch voltages isolated from RF for control of said RF power amplifier and said receiver RF amplifier.

* * * * *